(12) United States Patent
Yang et al.

(10) Patent No.: US 11,977,131 B2
(45) Date of Patent: May 7, 2024

(54) FAULT DETECTION FOR A SOLID STATE POWER CONVERTER

(71) Applicants: Rolls-Royce North American Technologies, Inc., Indianapolis, IN (US); Rolls-Royce Singapore Pte. Ltd., Singapore (SG)

(72) Inventors: Yu Yang, Singapore (SG); Chandana Jayampathi Gajanayake, Singapore (SG); David Loder, Carmel, IN (US); Amit Kumar Gupta, Singapore (SG)

(73) Assignees: Rolls-Royce North American Technologies, Inc., Indianapolis, IN (US); Rolls-Royce Singapore Pte. Ltd., Singapore (SG)

( * ) Notice: Subject to any disclaimer, the term of this patent is extended or adjusted under 35 U.S.C. 154(b) by 126 days.

(21) Appl. No.: 16/951,269

(22) Filed: Nov. 18, 2020

(65) Prior Publication Data

US 2022/0155383 A1    May 19, 2022

(51) Int. Cl.
*H02H 3/00* (2006.01)
*G01R 19/165* (2006.01)
(Continued)

(52) U.S. Cl.
CPC ....... *G01R 31/56* (2020.01); *G01R 19/16566* (2013.01); *H02H 1/0007* (2013.01); *H02H 7/1203* (2013.01)

(58) Field of Classification Search
CPC .............. G01R 31/56; G01R 19/16566; H02H 1/0007; H02H 7/1203
(Continued)

(56) References Cited

U.S. PATENT DOCUMENTS

| 4,733,321 A | 3/1988 | Lindeperg |
|---|---|---|
| 5,986,902 A | 11/1999 | Brkovic et al. |

(Continued)

FOREIGN PATENT DOCUMENTS

| WO | 2009056432 A1 | 5/2009 |
|---|---|---|
| WO | 2015097394 A1 | 7/2015 |

(Continued)

OTHER PUBLICATIONS

Bai, "Current Derivative Based Fault Detection and Localization in a Ring Bus DC Microgrid", Mar. 2020, 101 pgs.

(Continued)

*Primary Examiner* — Jared Fureman
*Assistant Examiner* — Lucy M Thomas
(74) *Attorney, Agent, or Firm* — Shumaker & Sieffert, P.A.

(57) ABSTRACT

In some examples, an electrical power system includes a solid state power converter including a first set of switches on a source side of the solid state power converter and a second set of switches on a load side of the solid state power converter. The electrical power system also includes a power source connected to the source side of the solid state power converter and also includes a differential bus connected to the load side of the solid state power converter. The electrical power system further includes a controller configured to receive a first signal indicating a current at the source side and receive a second signal indicating a current at the load side. The controller is further configured to detect, based on a time derivative of the first signal and a time derivative of the second signal, a fault in the electrical power system.

18 Claims, 13 Drawing Sheets

(51) Int. Cl.
  *G01R 31/56* (2020.01)
  *H02H 1/00* (2006.01)
  *H02H 7/12* (2006.01)

(58) Field of Classification Search
  USPC .......................................................... 361/78
  See application file for complete search history.

(56) References Cited

U.S. PATENT DOCUMENTS

| | | |
|---|---|---|
| 6,559,689 B1 | 5/2003 | Clark |
| 9,908,489 B2 | 3/2018 | Shipley et al. |
| 10,693,367 B1 | 6/2020 | Chatterjee et al. |
| 11,011,991 B1 | 5/2021 | Mercer |
| 2004/0061537 A1 | 4/2004 | Flasza |
| 2007/0183174 A1 | 8/2007 | Lee |
| 2009/0102405 A1 | 4/2009 | Hwang et al. |
| 2009/0121781 A1 | 5/2009 | Oyama et al. |
| 2010/0045102 A1 | 2/2010 | Kitanaka |
| 2010/0228413 A1 | 9/2010 | Fujitake |
| 2010/0312505 A1 | 12/2010 | Berger et al. |
| 2011/0241766 A1 | 10/2011 | Zhang et al. |
| 2012/0200966 A1 | 8/2012 | Hill et al. |
| 2012/0235661 A1 | 9/2012 | Roessler et al. |
| 2013/0088802 A1 | 4/2013 | Berggren et al. |
| 2013/0103220 A1* | 4/2013 | Eaves ................... H02H 7/261 700/293 |
| 2014/0132169 A1 | 5/2014 | Boeke |
| 2016/0041222 A1* | 2/2016 | Handy .................. G01R 35/00 324/750.3 |
| 2017/0104327 A1* | 4/2017 | Nojima .................. H03K 17/72 |
| 2019/0312514 A1 | 10/2019 | Hukel |
| 2021/0382102 A1* | 12/2021 | Siddique ............... G01R 31/52 |

FOREIGN PATENT DOCUMENTS

| | | |
|---|---|---|
| WO | 2015124885 A1 | 8/2015 |
| WO | 2017066233 A1 | 4/2017 |

OTHER PUBLICATIONS

Chang et al., "Review of different fault detection methods and their impact on pre-emptive VSC-HVDC dc protection performance", Aug. 2017, 9 pgs.
Jamali et al., "A High-Speed Fault Detection, Identification, and Isolation Method for a Last Mile Radial LVDC Distribution Network", Oct. 2018, 20 pgs.
Marvik et al., "Analysis of grib faults in offshore wind farm with HVDC connection", Jan. 2013, 10 pgs.
Raza et al. "A Protection Scheme for Multi-Terminal VSC-HVDC Transmission Systems", Dec. 2017, 8 pgs.
Yaqobi et al., "Low-Voltage Solid-State DC Breaker for Fault Protection Applications in Isolated DC Microgrid Cluster" Feb. 2019, 13 pgs.
Zhang et al., "A review on protection of DC microgrids", Mar. 2018, 15 pgs.
U.S. Appl. No. 17/100,225, by Rolls-Royce North American Technologies, Inc. (Inventors: Gajanayak et al.), filed Nov. 20, 2020.
Preliminary Search Report from counterpart French Application No. 2112035 dated Nov. 24, 2022, 19 pp.
Office Action from counterpart French Application No. 2112035 dated Oct. 24, 2023, 12 pp.

* cited by examiner

FAULT DETECTION FOR A SOLID STATE POWER CONVERTER

TECHNICAL FIELD

This disclosure relates to electrical power systems.

BACKGROUND

An electrical power system may include a power source and a load separated by a solid state power converter. The solid state power converter may allow power to flow in either direction between the power source and the load. The solid state power converter may include a set of source-side switches and a set of load-side switches, with an optional middle capacitor connected between the source-side switches and the load-side switches.

SUMMARY

This disclosure describes techniques for detecting a fault in an electrical power system that includes a solid state power converter and a controller. The controller may be configured to receive signals indicating the current and/or voltage on the source side and the load side of the solid state power converter. Based on the received signals, the controller can determine that a fault has occurred in the electrical power system.

The techniques of this disclosure may allow for faster detection of a fault, as compared to existing techniques that use a signal received from only one sensor on the solid state power converter. A controller implementing the techniques of this disclosure may be able to determine the location of the fault by using signals received from multiple sensors on the solid state power converter. The techniques may also allow for distinguishing between a fault and a load change such as an overload condition.

In some examples, an electrical power system includes a solid state power converter including a first set of switches on a source side of the solid state power converter and a second set of switches on a load side of the solid state power converter. The electrical power system also includes a power source connected to the source side of the solid state power converter and also includes a differential bus connected to the load side of the solid state power converter. The electrical power system further includes a controller configured to receive a first signal indicating a current at the source side and receive a second signal indicating a current at the load side. The controller is further configured to detect, based on a time derivative of the first signal and a time derivative of the second signal, a fault in the electrical power system.

In some examples, a method includes receiving, at circuitry of a controller, a first signal indicating a current at a source side of a solid state power converter. The method also includes receiving, at the circuitry, a second signal indicating a current at a load side of the solid state power converter. The method further includes detecting, by the circuitry, a fault based on a time derivative of the first signal and further based on a time derivative of the second signal.

In some examples, an electrical power system includes a solid state power converter including a first set of switches on a source side of the solid state power converter, a second set of switches on a load side of the solid state power converter, and a middle capacitor connected between the first set of switches and the second set of switches. The electrical power system also includes a power source connected to the source side of the solid state power converter and further includes a differential bus connected to the load side of the solid state power converter. The electrical power system a controller configured to receive a first signal indicating a voltage level at the source side of the solid state power converter, receive a second signal indicating a voltage level across the differential bus, and receive a third signal indicating a voltage level across the middle capacitor. The controller is further configured to detect a fault in the electrical power system based on a first difference between the first signal and the third signal and further based on a second difference between the third signal and the second signal.

The details of one or more examples are set forth in the accompanying drawings and the description below. Other features, objects, and advantages will be apparent from the description and drawings, and from the claims.

DETAILED DESCRIPTION

This disclosure describes techniques for detecting a fault based on signals received from current sensors and/or voltage sensors in an electrical power system. The techniques of this disclosure can be used by a controller in an electrical power system that includes a solid state power converter, regardless of whether the solid state power converter includes a middle capacitor. The controller may be configured to quickly detect the occurrence and/or location of a fault within the electrical power system using the techniques of this disclosure.

In some examples, the controller receives a first current-sense signal from the source side of the solid state power converter and a second current-sense signal from the load side of the solid state power converter. The controller may be configured to detect a fault based on magnitudes of the current-sense signals, based on magnitudes of the time derivatives of the current-sense signals, and/or based on magnitudes of the second time derivatives (e.g., double derivatives) of the current-sense signals. Additionally or alternatively, the controller may receive voltage signals from both sides of the solid state power converter, including a voltage signal from the middle capacitor of the solid state power converter. The controller may be configured to detect the occurrence and/or location of a fault based on the voltage signals.

Figure 1:
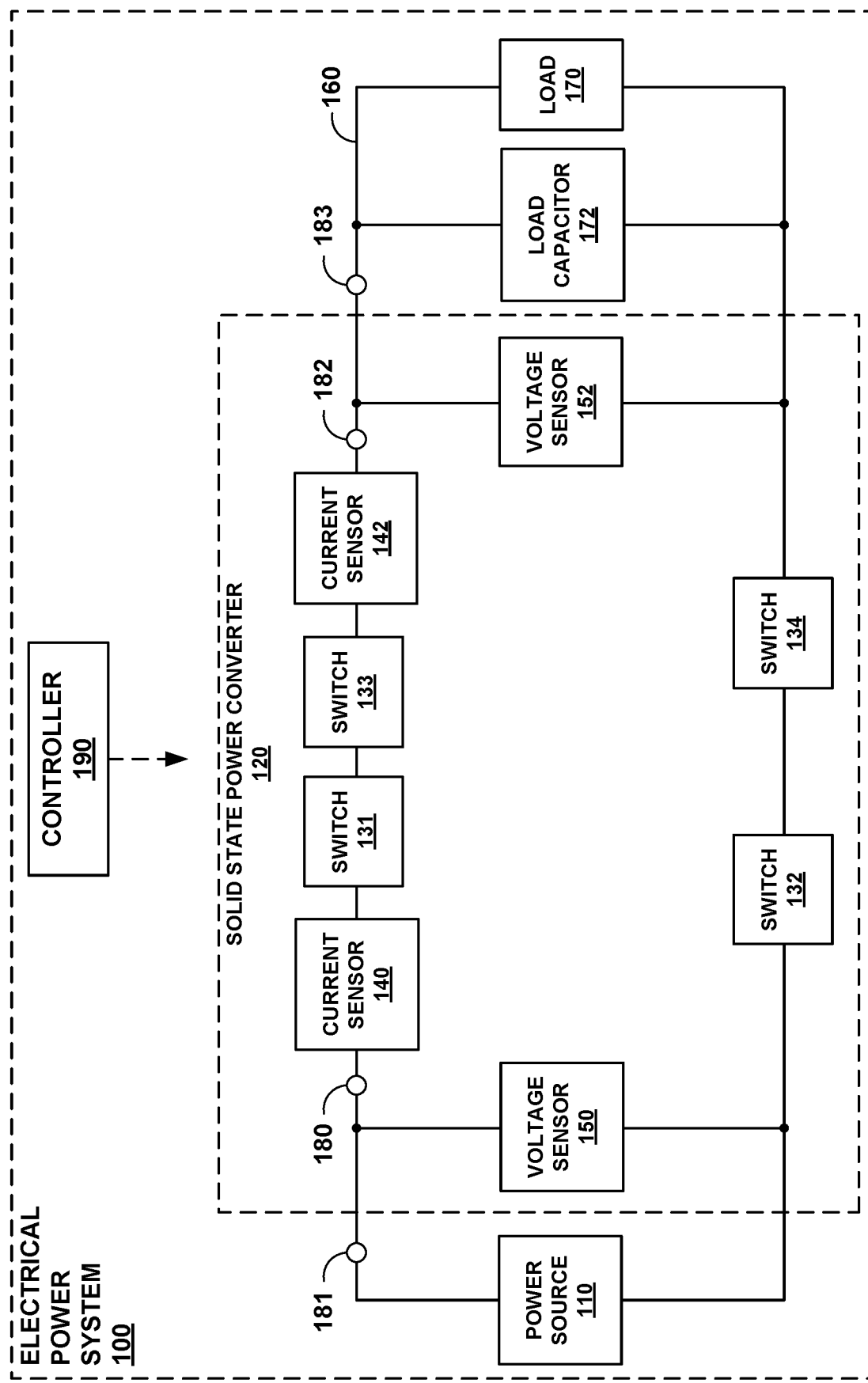
FIGS. 1 and 2 are conceptual block diagrams illustrating electrical power systems including a solid state power converter and a controller, in accordance with one or more techniques of this disclosure.
Figure 2:
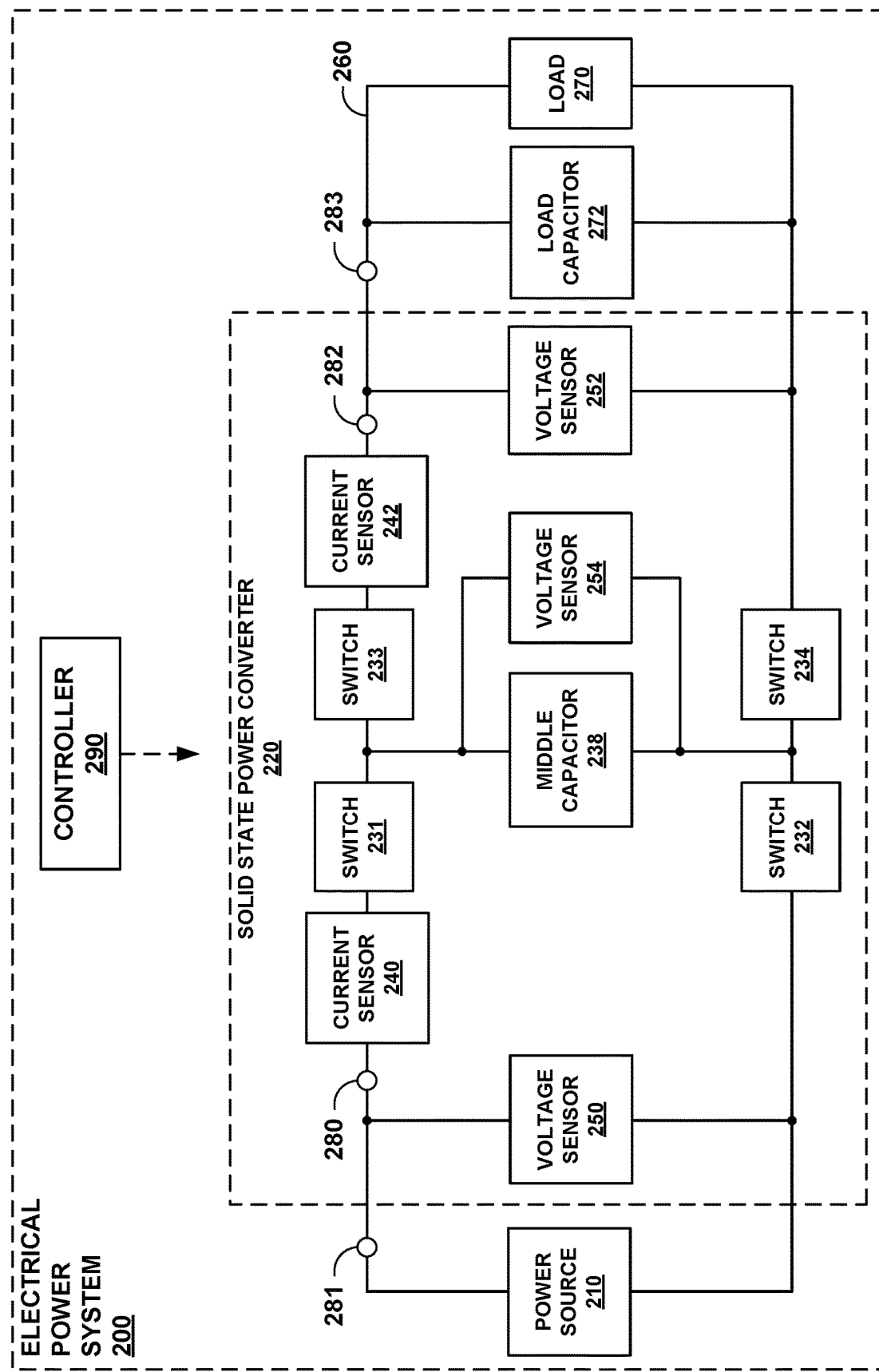

FIGS. 1 and 2 are conceptual block diagrams illustrating electrical power systems 100 and 200 including solid state power converters 120 and 220 and controllers 190 and 290 and 290, in accordance with one or more techniques of this disclosure. Solid state power converter 220 of electrical power system 200 includes middle capacitor 238 and voltage sensor 254, which are not are part of solid state power converter 120 in the example shown in FIG. 1. Each of controllers 190 and 290 may be configured to perform the techniques of this disclosure based on electrical signals received by controllers 190 and 290 from any of current sensors 140, 142, 240, and 242 and voltage sensors 150, 152, 250, 252, and 254. Electrical power systems 100 and 200 may include additional sensors in some examples, and the number and positions of the sensors may be selected to provide a number of sensors in the solid state power converter that accounts for the mass and cost of each additional sensor. Any feature or functionality attributed by this disclosure to electrical power system 100 or 200 or to controller 190 or 290 may be a feature or function of one or both of electrical power systems 100 and 200 and/or one or both of controllers 190 and 290.

Electrical power system 100 is configured to deliver electrical power generated by power source 110 to load 170 via solid state power converter 120 and differential bus 160. Solid state power converter 120 is depicted as including four switches 131-134, although other numbers and arrangements of switches are possible for solid state power converter 120. Electrical power system 100 includes load capacitor 172 connected across differential bus 160 in parallel with load 170. Additional example details of the arrangement and operation solid state power converters are described in commonly assigned U.S. Pat. No. 10,693,367, entitled "Pre-Charging Circuit for Power Converter," filed on Feb. 19, 2019, and issued on Jun. 23, 2020, the entire contents of which are incorporated herein by reference.

However, FIG. 1 show just one example of electrical power system 100, and many other examples of electrical power systems may use the techniques described herein, including electrical power system 200 shown in FIG. 2. For instance, in some examples, electrical power system 100 may be configured to operate in a reverse direction, where electrical power system 100 includes a power source coupled to differential bus 160 and a load coupled to switches 131 and 132. In other examples, electrical power system 100 is a bi-directional system where power source 110 or load 170 can operate as a power source and/or an electrical load. For example, power source 110 or load 170 may include a rechargeable battery, a motor-generator, and/or any other element that can operate as a power source or a load. To accommodate bidirectional operation, the electrical lines between power source 110 and switches 131 and 132 may include a differential bus.

Electrical power system 100 may include a micro-grid, a mixed alternating-current/direct-current (AC/DC) system, an AC/AC system, a DC/DC system, an AC bus, a DC bus, and/or any other type of electrical system. Electrical power system 100 may also be part of a power generation system such as a power plant, a power distribution system, and/or a residential or commercial power system, which may include energy storage and electrical loads. Electrical power system 100 may be a part of an aerospace, marine, military, and/or automotive system. The techniques of this disclosure may be especially useful in electrical vehicles, such as for the battery disconnect systems in electrical vehicles. Electrical power system 100 may be part of a vehicle such as any manned or unmanned: air vehicle, land vehicle (including military and/or farm vehicles), marine vehicle, space vehicle, and the like, which may include an engine, a generator, an alternator, and/or a power distribution system.

Power source 110 may be configured to generate electrical power. Power source 110 can include an electric generator that converts mechanical power derived from a shaft, rotor, and/or other mechanical component to electrical power for use by other components or circuits of electrical power system 100. In some examples, the electric generator may also be mounted to a mechanical distribution system and/or a mechanical transmission system (for clarity in the drawings, neither of which is shown). In some examples, electrical power system 100 may include one or more additional power sources, although not shown in FIG. 1. Power source 110 can include an AC generator such as an induction generator or a DC generator that produces DC electricity. Power source 110 may include a wound field machine, a Halbach array generator with permanent magnets on a rotor that is driven by an engine shaft or a propulsor shaft, or any other type of generator.

Power source 110 may, in some examples, generate AC electricity (e.g., multi-phase AC electricity), and electrical power system 100 may include a power converter to generate DC electricity based on the power generated by power source 110. The power converter may be a rectifier circuit that converts AC electricity to DC electricity. Power source 110 may be connected to source-side switches 131 and 132 by electrical lines. These electrical lines may include line inductances 180 and 181 that affect the conduction of electricity along the electrical lines, for example, by resisting changes in current.

Solid state power converter 120 are connected between power source 110 and load 170. Solid state power converter 120 may include two source-side switches 131 and 132 and two load-side switches 133 and 134. A fault may occur on the source side of solid state power converter 120, for example, by occurring on an electrical line between power source 110 and one of switches 131 and 132. A fault may occur on the load side of solid state power converter 120, for example, by occurring on an electrical line between load 170 and one of switches 133 and 134. The fault may occur for many potential reasons, including the breakdown of insulation on an electrical line and/or the failure of a switch or a capacitor. A fault may include a short circuit fault, a low resistance fault, a ground fault, and/or any other type of fault.

Differential bus 160 may operate as a DC bus, where the voltage level on each of the rails is a DC value during normal operation. The target voltage level across differential bus 160 may be tens or hundreds of volts, such as 28 volts, 270 volts, 540 volts, or 750 volts in some examples. The voltage level across differential bus 160 may also be lower than or higher than the voltage generated by power source 110. To increase the voltage level across differential bus 160, controller 190 can control solid state power converter 120 to transfer energy from power source 110 to differential bus 160.

Load 170 may include a power converter configured to convert the power received from power source 110 to another form of electricity for an electrical load (not shown in FIG. 1). The power converter may produce electrical power in a form that is usable by an electrical load. For example, load 170 may include an inverter configured to convert DC electricity received by load 170 to AC electricity for an electric motor. In some examples, electrical power system 100 can include a load that takes electricity directly from differential bus 160 without a converter. Load 170 and load capacitor 172 may be connected to load-side switches 133 and 134 by electrical lines. These electrical lines may include line inductances 182 and 183 that affect the conduction of electricity along the electrical lines. Electrical power system 100 may include additional inductances 180-183 that slow the rise of current during a short-circuit fault.

Load capacitor 172 may be coupled between the rails of differential bus 160. The power generated by power source 110 that differential bus 160 receives from solid state power converter 120 can be filtered by load capacitor 172. Load capacitor 172 can act as a low-pass filter for the energy transferred from power source 110 to differential bus 160. Load capacitors 172 can filter the ripple generated by power sources 110 or by converter 170 by preventing ripple currents from reaching back to power sources 110 and smoothing out variations in the voltage across differential bus 160.

Controllers 190 may be configured to control the operation of solid state power converters 120 and any or all of sensors 140, 142, 150, and 152. Additionally or alternatively, controller 190 may be configured to control the operation of power source 110 and/or load 170. For example, controller 190 can control the operation of load 170 by delivering control signals to the switches of the converters of load 170. Controller 190 may be configured to control a mode of operation of solid state power converter 120 to deliver power to differential bus 160 and/or to load 170. Controller 190 may also be able to activate or deactivate power source 110 or otherwise control a mode of operation of power source 110 to deliver different levels and/or types of power.

Controller 190 may include any suitable arrangement of hardware, software, firmware, or any combination thereof, to perform the techniques attributed to controller 190 herein. Examples of controller 190 include any one or more microprocessors, digital signal processors (DSPs), application specific integrated circuits (ASICs), full authority digital engine control (FADEC) units, engine control units (ECUs), field programmable gate arrays (FPGAs), or any other equivalent integrated or discrete logic circuitry, as well as any combinations of such components. When controller 190 include software or firmware, controller 190 further include any hardware for storing and executing the software or firmware, such as one or more processors or processing units. In examples in which electrical power system 100 is mounted on a vehicle, controller 190 may be implemented by a FADEC unit.

In general, a processing unit may include one or more microprocessors, DSPs, ASICs, FPGAs, or any other equivalent integrated or discrete logic circuitry, as well as any combinations of such components. Although not shown in FIG. 1, controller 190 may include a memory configured to store data. The memory may include any volatile or non-volatile media, such as a random access memory (RAM), read only memory (ROM), non-volatile RAM (NVRAM), electrically erasable programmable ROM (EEPROM), flash memory, and the like. In some examples, the memory may be external to controller 190 (e.g., may be external to a package in which controller 190 is housed).

Controller 190 may include circuitry for determining whether a signal is greater than a threshold level. Controller 190 may also include circuitry for determining first and/or second time derivatives of signals. Controller 190 may include circuitry for determining a difference between signals. The circuitry for thresholding, determining time derivatives, and/or determining differences may include analog circuitry, digital circuitry, and/or instructions stored to a memory device. For example, controller 190 may include an operational amplifier for differentiating a first signal to generate a second signal that is equal to the time derivative of the first signal.

Controller 190 can deliver control signals to a control terminal of each of switches 131-134 to activate or deactivate each of switches 131-134. Controller 190 may be configured to control solid state power converter 120 based on signals received from sensors to achieve a voltage target or to implement a startup routine or a shutdown routine. By controlling switches 131-134, controller 190 may be able to control the charging and discharging of capacitor 172 and the voltage and current on differential bus 160. Switches 131-134 may include one or more insulated-gate bipolar transistors, metal-oxide-semiconductor field-effect transistors (FETs), junction FETs, high electron mobility transistors, and/or any other transistor devices. Switches 131-134 may include materials such as GaN and/or SiC and may include antiparallel diodes in some examples.

To activate one of switches 131-134, controller 190 can deliver an enabling control signal to the control terminal of the respective switch. Responsive to receiving the enabling control signal, the respective switch may close and allow current to flow across the switch (e.g., between the load terminals of the switch). The enabling control signal, along with a voltage difference across the respective switch, may cause or facilitate the flow of electricity across the respective switch. To deactivate one of switches 131-134, controller 190 can deliver a disabling control signal to the control terminal of the respective switch. Responsive to receiving the disabling control signal, the respective switch may open and prevent current from flowing across the switch.

Existing methods for detecting faults in an electrical power system may be relatively slow and may not allow for determining the location of the fault. An existing method can include determining that a sensed voltage or a sensed current is greater than or less than a threshold level. This existing method may not be able to detect a fault where a differential voltage and/or a line current is being sensed and the fault pulls up or pulls down both rails of the differential bus. Another existing fault detection circuit may use a desaturation circuit or a device current, which may work well for a solid state power converter without a middle capacitor. However, a decoupling middle capacitor brings new features that allows for enhanced fault detection techniques. For example, enhanced short-circuit fault detection circuits may be based on current derivatives and voltage differences for early detection of load short-circuit faults. In addition, two-step fault tolerant detection and isolation processes can be used to clear short-circuit faults and faults that prevent devices from turning off.

In accordance with various aspects of the techniques of this disclosure, controller 190 may be configured to detect a fault based on magnitudes of the signals received from sensors 140, 142, 150, and/or 152. For example, controller 190 may be configured to detect a fault in response to determining that a magnitude of the time derivative of signals from current sensors on both sides of a solid state power converter is greater than a threshold level. Additionally or alternatively, controller 190 may be configured to determine on which side a fault occurred based on the magnitude of a signal from one side of a solid state power converter is greater than a threshold level but the magnitude of a signal from the other side of the solid state power converter is greater than the threshold level. In this way, controller 190 may perform various aspects of the techniques to detect a fault in solid state power converter 120 or on the electrical lines connected to solid state power converter 120 (e.g., on differential bus 160).

In solid state power converter 120 without a middle capacitor, the current on opposite sides of solid state power converter 120 may be the same because there is no capacitor to store or release charge. However, in solid state power converter 220 shown in FIG. 2 with middle capacitor 238, the currents may be different during transient conditions because of the charging or discharging of middle capacitor 238. Hence, the difference of the currents can indicate the location of a fault, which may be similar to short-circuit fault detection processes based on a desaturation circuit or a device current derivative. However, when a short-circuit fault is detected using a desaturation circuit or a device current, the fault current amplitude may be large enough. Keeping the device exposed to such a fault for a long duration may damage or destroy a power device. Various aspects of the fault detection techniques described in this disclosure that are based on a current derivative allow for detecting a fault at an earlier stage.

Electrical power system 200 shown in FIG. 2 is similar to electrical power system 100 shown in FIG. 1 and controllers 190 and 290 may be configured to operate in similar manners, except that electrical power system 200 includes middle capacitor 238 connected between source-side switches 231 and 232 and load-side switches 233 and 234. Middle capacitor 238 can help with decoupling the charging of load capacitor 272 and also help to decouple a fault that occurs in the downstream network from the upstream network. Electrical power system 200 also includes voltage sensor 252 for sensing the voltage across middle capacitor 238.

Electrical power system 200 includes power source 210, solid state power converter 220, sensors 240, 242, 250, 252, and 254, differential bus 260, load 270, load capacitor 272, line inductances 280-283, and controller 290. By controlling switches 231-234, controller 290 may connect power source 210 and middle capacitor 238 to charge middle capacitor 238. Controller 290 can activate switches 231 and 232 and deactivate switches 233 and 234 to connect middle capacitor 238 to power source 210 and concurrently isolate middle capacitor 238 from differential bus 260 and load 270. Controller 290 can deactivate switches 231 and 232 and activate switches 233 and 234 to connect middle capacitor 238 to differential bus 260 and load 270 and concurrently isolate middle capacitor 238 from power source 210.

The techniques of this disclosure can be used alone or in any combination to provide redundancy and cross-checking for detecting and locating a fault. The techniques of this disclosure may also be used in combination with existing methods for additional redundancy and cross-checking. Additionally or alternatively, controllers 190 and 290 may be configured to use fail-safe deactivation techniques to limit the exposure of electrical power systems 100 and 200 to a fault.

DC power distribution may provide an important capability for the aerospace and marine industries. In other words, systems that can provide power control and protection may represent vital parts of this capability, and solid state power converters 120 and 220 can provide this control and protection in electrical power systems 100 and 200. This disclosure describes a number of techniques for detecting a fault in, for example, a bidirectional DC solid state power converter architectures. One of the possible architectures for solid state power converters 120 and 220 is able to protect the differential bus system by independently isolating the positive and negative rails of the bus in case of a short circuit and/or ground fault. This architecture allows for a fast soft-charging technique with a self-heal capacitor for middle capacitor 238 with decoupled charging of bulk capacitor 272 to avoid inrush current. This architecture with decoupling capacitor 238 allows for new fault detection techniques that can exploit the full potential of the architecture.

Figure 3:
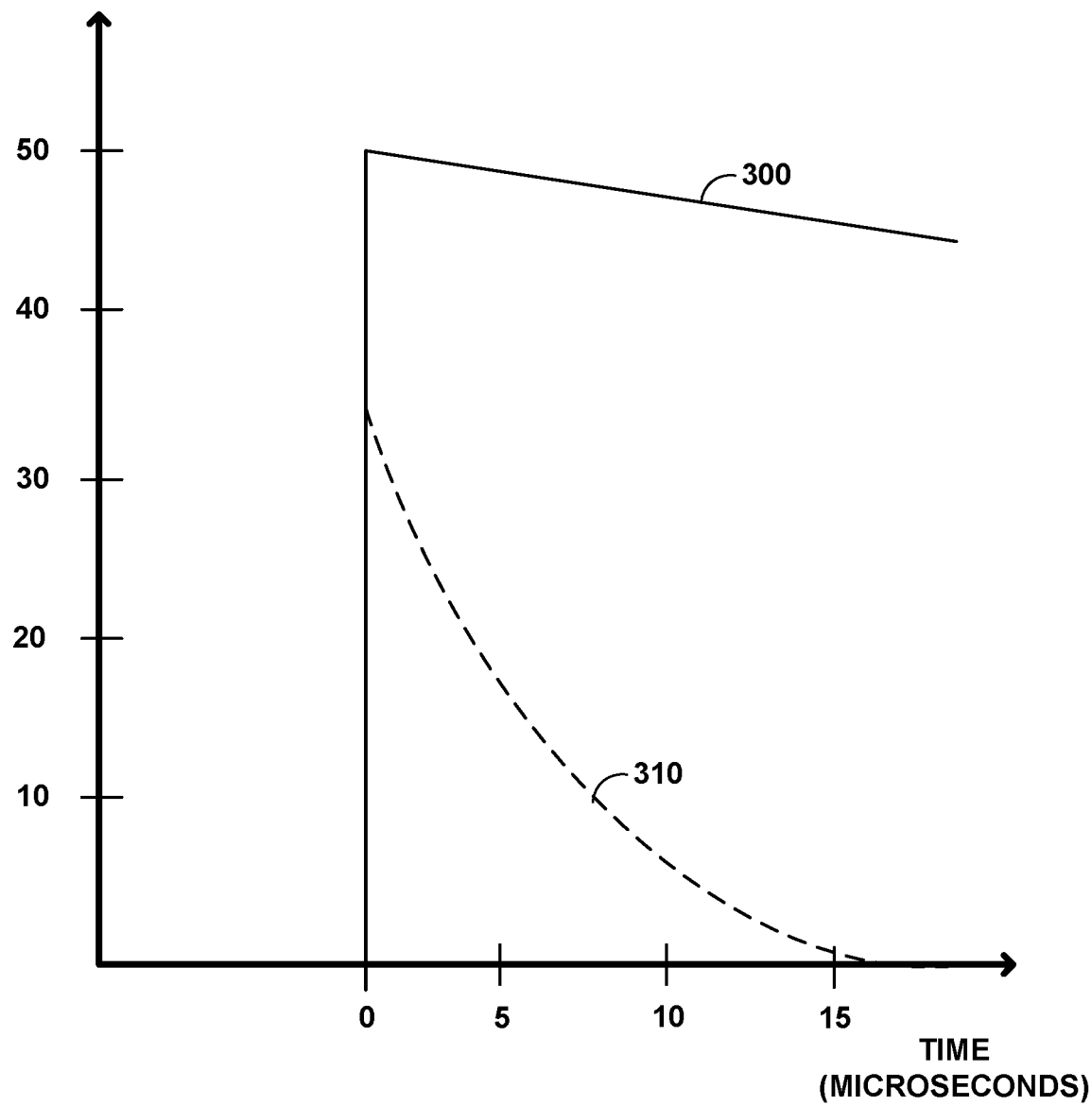
FIGS. 3-8 are plots of electrical characteristics in electrical power systems over time, in accordance with one or more techniques of this disclosure.
Figure 4:
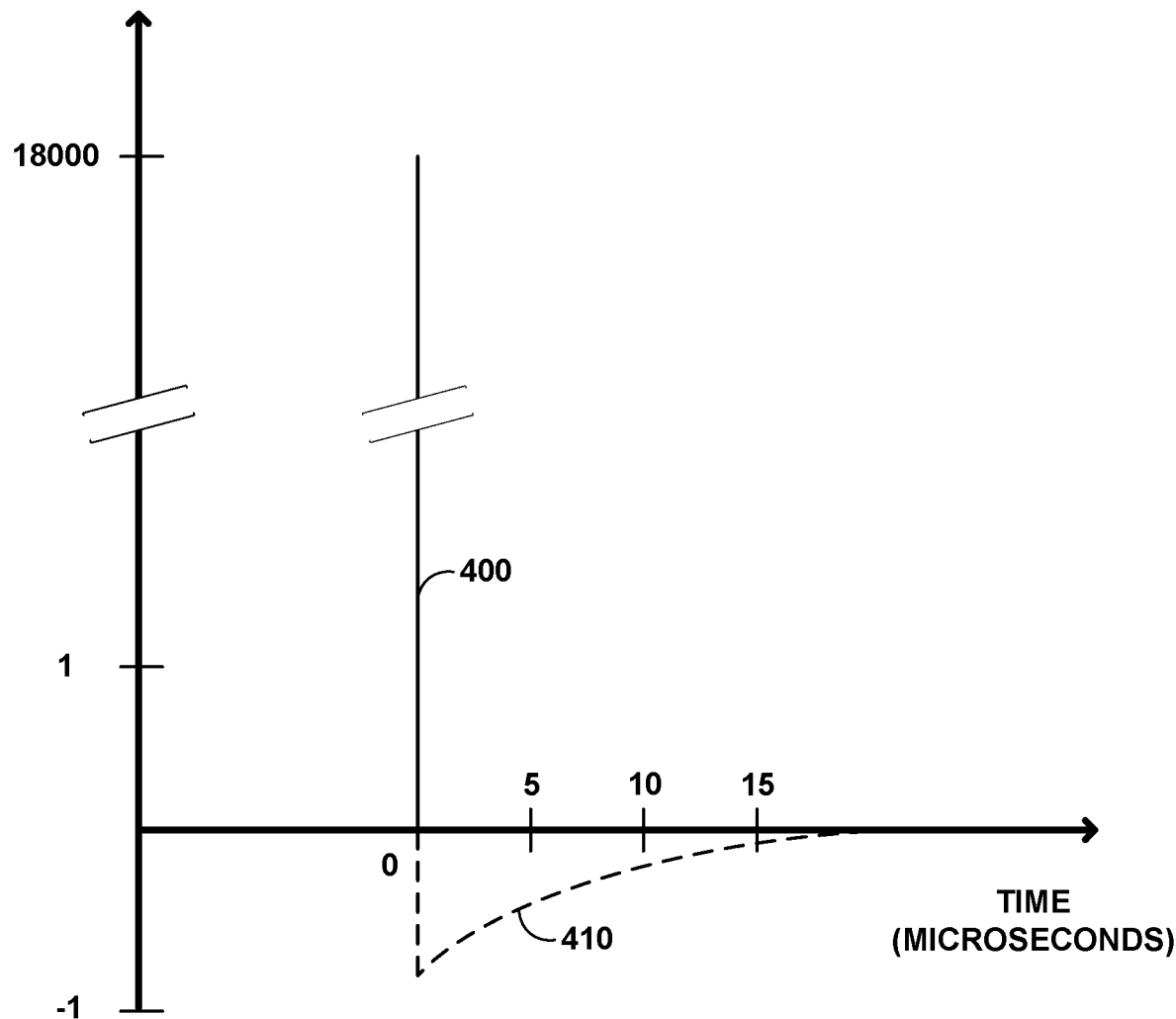

FIGS. 3-8 are plots of electrical characteristics in electrical power systems over time, in accordance with one or more techniques of this disclosure. The techniques illustrated by the electrical characteristics shown in the examples of FIGS. 3 and 4 are described with reference to controller 190 shown in FIG. 1, and the techniques illustrated by the electrical characteristics shown in the examples of FIGS. 5-8 are described with reference to controller 290 shown in FIG. 2, but the techniques illustrated by the electrical characteristics shown in the examples of FIGS. 3-8 may be performed by either of controllers 190 and 290. Although FIGS. 3-8 depict current and voltage sensed by the sensors shown in FIGS. 1 and 2, the actual signals received by controllers 190 and 290 may be indications of the currents and voltages in electrical power systems 100 and 200. For example, controllers 190 and 290 may be configured to receive a signal indicating a voltage across a shunt resistor, indicating the output of a current mirror, indicating the output of Hall sensor, and/or indicating the output of a magnetoresistive sensor.

FIG. 3 depicts the time derivatives of the currents sensed by current sensors 140 and 142 during a fault and during an overload condition. Waveform 300 represents the time derivative of the currents sensed by current sensors 140 and 142 before and after the occurrence of a fault in electrical power system 100. Because electrical power system 100 does not include a middle capacitor (e.g., middle capacitor 238), the currents sensed by current sensors 140 and 142 may be equal. Without the capacitance of a middle capacitor to store charge, the current into solid state power converter 120 should equal the current out of solid state power converter 120.

Before the occurrence of the fault at time zero, the time derivative of the currents sensed by current sensors 140 and 142 is equal to zero because the currents are stable. When the fault occurs at time zero, the time derivative of the currents increases immediately to a high level (e.g., fifty megaamperes per second) and declines slowly (e.g., by less than one megaampere per second per microsecond).

Waveform 310 represents the time derivative of the currents sensed by current sensors 140 and 142 before and after the occurrence of an overload condition in electrical power system 100. In some examples, the overload condition may be an instantaneous three-fold increase in the impedance of load 170. Before the occurrence of the overload condition at time zero, the time derivative of the currents sensed by current sensors 140 and 142 is equal to zero because the currents are stable. When the overload condition occurs at time zero, the time derivative of the currents increases immediately to a moderate level that is lower than the level associated with a fault. After the initial occurrence of the overload condition, the time derivative of the current declines rapidly to zero (e.g., by several megaamperes per second per microsecond) as the current stabilizes.

Both the fault and overload conditions cause a transient high current derivative spike for a solid state power converter 120 without a middle capacitor as the current rises rapidly in both cases. However, the high current derivative starts to decay as time lapses during the load step change represented by waveform 310, while waveform 300 remains at a high value for a much longer period during a fault. Based on knowledge of the current single derivative, it is possible for controller 190 to detect a fault.

To detect a fault, controller 190 may be configured to receive signals from current sensors 140 and 142. Controller 190 may be further configured to determine the time derivative of each of the signals received from current sensors 140 and 142. In some examples, controller 190 is configured to sum the signals received from current sensors 140 and 142 before or after determining the time derivatives of the signals. Controller 190 may be configured to compare the magnitude of time derivatives of the signals to one or more threshold levels to determine whether the magnitudes of the time derivatives are greater than the threshold levels. Controller 190 may be configured to determine that a fault has occurred in electrical power system 100 in response to determining that the magnitude of the time derivative of the signal received from current sensor 140 is greater than a first threshold level and further in response to determining that the magnitude of the time derivative of the signal received from current sensor 142 is greater than a second threshold level. The first and second threshold levels may be the same level or different levels.

In the example shown in FIG. 3, a threshold level of forty megaamperes per second can be used to distinguish a fault from an overload condition. Using signals received from the source side of electrical power system 100 (e.g., from current sensor 140) and from the load side of electrical power system 100 (e.g., from current sensor 142) allows controller 190 use two data sources for the determination that a fault has occurred, thereby ensuring a more accurate determination that is unaffected by an error at one of current sensors 140 and 142.

Controller 190 may be configured to also check whether magnitudes of the time derivatives of one or more of the signals received from current sensors 140 and 142 are greater than the threshold level(s) after a threshold time duration. For example, controller 190 may be configured to determine whether the time derivative of a signal received from current sensor 140 or 142 is greater than a threshold level at a first time. Controller 190 may be configured to then determine whether a magnitude of the time derivative of the signal is greater than the threshold level at a second time that is at least a threshold time duration after the first time. Controller 190 may be configured to use a timer to determine that the threshold time duration has passed. The threshold time duration may be five or ten microseconds for detecting a fault in the example shown in FIG. 3.

By using a threshold time duration to retest the time derivative of the signal received from one or more of current sensors 140 and 142, controller 190 can distinguish between a fault and an overload condition. For example, one microsecond after the occurrent of a fault or an overload condition, the difference in magnitude of waveforms 300 and 310 may be twenty megaamperes per second. Five microseconds after the occurrence of a fault or an overload condition, the difference in magnitude of waveforms 300 and 310 may be forty megaamperes per second because waveform 310 declines much more rapidly than waveform 300. Rechecking the time derivative after a threshold time duration allows controller 190 to confirm that a fault, rather than overload condition, has occurred.

FIG. 4 depicts the second time derivatives of the currents sensed by current sensors 140 and 142 during a fault and during an overload condition. Waveform 400 represents the second time derivative of the currents sensed by current sensors 140 and 142 before and after the occurrence of a fault in electrical power system 100. Before the occurrence of the fault at time zero, the second time derivative of the currents sensed by current sensors 140 and 142 is equal to zero because the currents are stable. When the fault occurs at time zero, the second time derivatives spike immediately to a high level (e.g., $10^{17}$ megaamperes per second squared) and then declines immediately to nearly zero.

Waveform 410 represents the second time derivative of the currents sensed by current sensors 140 and 142 before and after the occurrence of an overload condition in electrical power system 100. Before the occurrence of the overload condition at time zero, the time derivative of the currents sensed by current sensors 140 and 142 is equal to zero because the currents are stable. When the overload condition occurs at time zero, the time derivative of the currents spikes and immediately decreases to negative level, indicating that the increase of the current is decreasing (e.g., stabilizing). The instantaneous current double derivative is relatively higher when caused by a fault, as compared to the double derivative caused by an overload scenario. The current double derivative at one microsecond after a short circuit fault has a lower magnitude than the double derivative in overload scenario.

To detect a fault, controller 190 may be further configured to determine the second time derivative of each of the signals received from current sensors 140 and 142. Controller 190 may be configured to compare the magnitude of the second time derivatives of the signals to one or more threshold levels to determine whether the magnitude of the second time derivatives are greater than the threshold levels. Controller 190 may be configured to determine that a fault has occurred in electrical power system 100 in response to determining that the magnitude of the second time derivative of the signal received from current sensor 140 is less than a first threshold level and further in response to determining that the magnitude of the second time derivative of the signal received from current sensor 142 is less than a second threshold level.

The use of a second time derivative may be combined with the techniques described with respect to FIG. 3 or any other figure herein. For example, controller 190 may be configured to first determine that magnitudes of the time derivatives of the signals received from current sensors 140 and 142 are greater than a threshold level. In response to determining that magnitudes of the time derivatives are greater than the threshold level, controller 190 may be configured to determine whether the magnitude of the second time derivatives is less than another threshold level, where the magnitude may represent the absolute value of the second time derivative in some examples. After the occurrence of an overload condition, waveform 410 remains at a higher (negative) magnitude than the magnitude of waveform 400 after the occurrence of a fault.

Controller 190 may be configured to also check whether the second time derivatives of one or more of the signals received from current sensors 140 and 142 is greater than a threshold level after a threshold time duration. For example, controller 190 may be configured to determine whether the second time derivative of a signal received from current sensor 140 or 142 is greater than a threshold level at a first time. Controller 190 may be configured to then determine whether the second time derivative of the signal is greater than the threshold level at a second time that is at least a threshold time duration after the first time. Controller 190 may be configured to use a timer to determine that the threshold time duration has passed. The threshold time duration may be five microseconds for detecting a fault in the example shown in FIG. 4.

In some examples, controller 190 is configured to detect a fault by at least determining that the magnitude of a second time derivative has quickly spiked and then decreased. Controller 190 may be configured to confirm the fault by at least determining that a magnitude of the second time derivative is less than a threshold level after the spike occurs.

Figure 5:
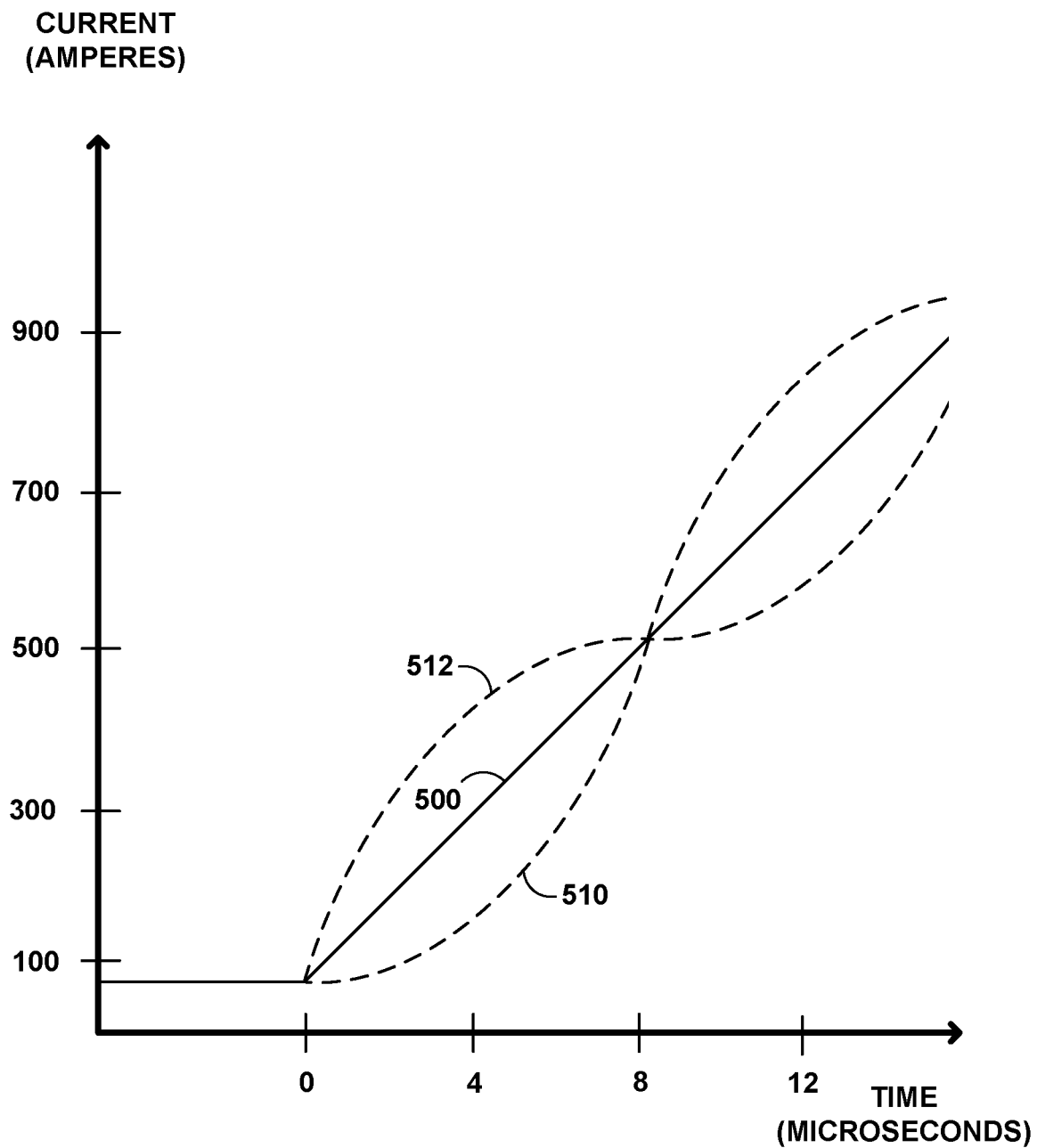

FIG. 5 depicts the currents sensed by current sensors 140, 142, 240, and 242 during a fault. Waveform 500 represents the current sensed by current sensors 140 and 142, which ideally should both be equal, before and after the occurrence of a fault in electrical power system 100. Before the occurrence of the fault at time zero, waveform 500 is stable at approximately seventy amperes. When the fault occurs at time zero, waveform 500 increases linearly from seventy amperes. The current sensed by both of current sensors 140 and 142 should be roughly equal because there is no middle capacitor in solid state power converter 120 to sink or source current.

Waveform 510 represents the current sensed by current sensor 240, and waveform 512 represents the current sensed by current sensor 242 before and after the occurrence of a fault in electrical power system 200. Before the occurrence of the fault at time zero, the currents sensed by current sensors 240 and 242 are stable at approximately seventy amperes. When a fault occurs on the load side of solid state power converter 220 at time zero, waveform 512 increases rapidly, and waveform 510 increases slowly. For example, the fault may occur between the rails of differential bus 260 or across load capacitor 272. Initially, the fault may cause a sharp increase in the current sensed by current sensor 242 but not necessarily a sharp increase in the current sensed by current sensor 240. In other words, the side with a current that reaches a high threshold level first may be the side with the fault. Instead of following a ramp pattern, waveforms 510 and 512 increase along the sum of a sinusoidal waveform and a ramp waveform due to the LC resonance of transmission line inductances 280-283 and middle capacitor 238.

To detect a fault, controller 290 may be further configured to determine that a magnitude of the signal received from current sensor 242 is greater than a first threshold level and that a magnitude of the signal received from current sensor 240 is not greater than a second threshold level. The first and second threshold levels may be the same or different levels. In the example of FIG. 5, the threshold levels may correspond to two hundred, three hundred, or four hundred amperes. Responsive to determining that a magnitude of one signal is greater than a threshold and a magnitude of the other signal is not greater than a threshold, controller 290 may determine that the fault has occurred on the same side as the signal that is greater than the threshold. The use of a current from both sides of solid state power converter 220 may allow for quick detection of a fault and a quick determination of the side on which the fault has occurred.

Figure 6:
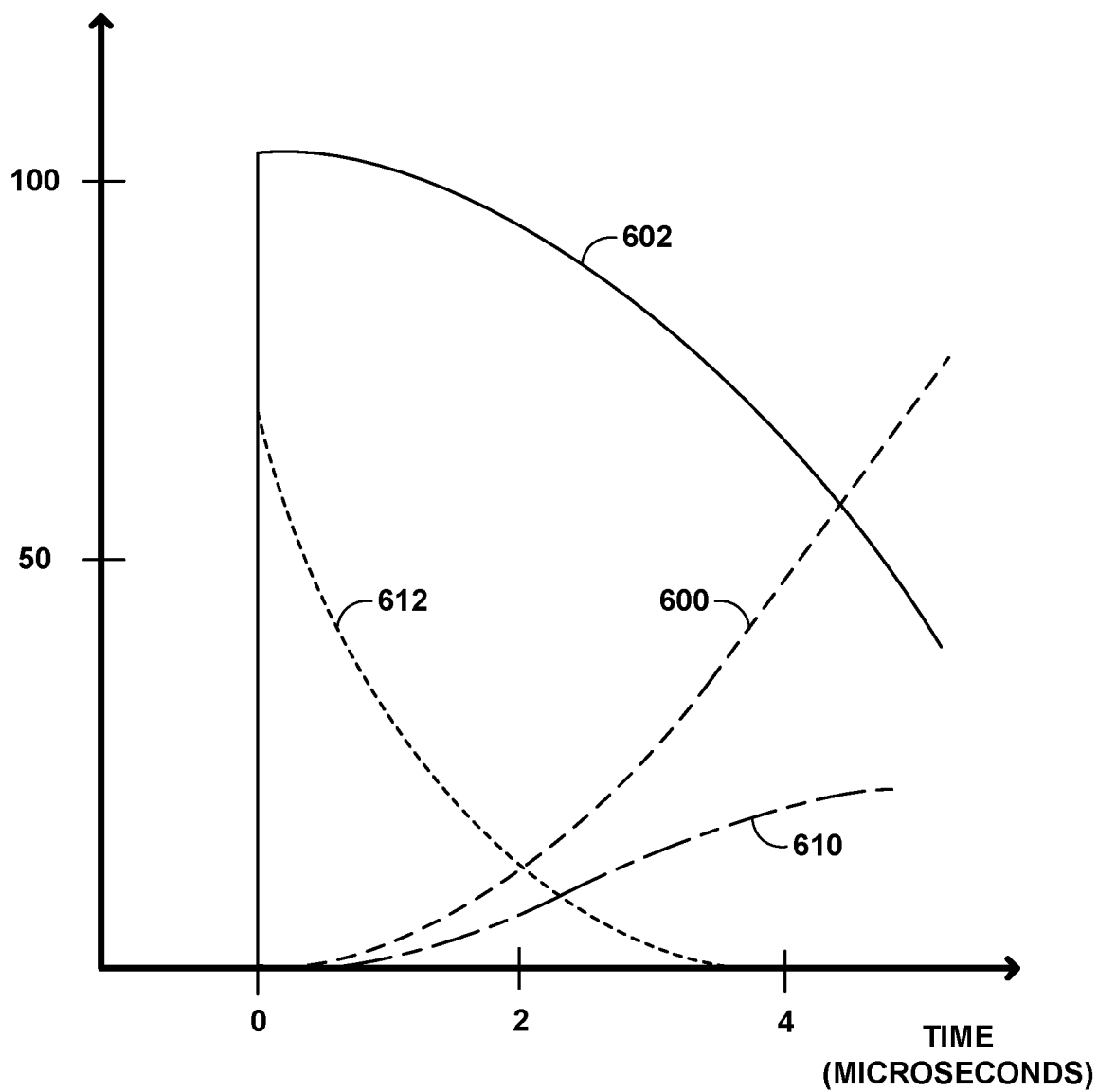

FIG. 6 depicts the time derivatives of the currents sensed by current sensors 240 and 242 during a fault and during an overload condition. Waveform 600 represents the time derivative of the current sensed by current sensor 240 before and after the occurrence of a fault on the load side of solid state power converter 220. Before the occurrence of the fault at time zero, waveforms 600, 602, 610, and 612 are equal to zero because the currents in electrical power system 200 are stable. When the fault occurs at time zero, waveform 600 increases slowly at first. Waveform 602 represents the time derivative of the current sensed by current sensor 242 before and after the occurrence of a fault on the load side of solid state power converter 220. When the fault occurs at time zero, waveform 602 increases immediately to a high level and then declines.

Waveform 610 represents the time derivative of the current sensed by current sensor 240 before and after the occurrence of an overload condition (e.g., a load step) in electrical power system 200. When the overload condition starts at time zero, waveform 610 increases slowly. Waveform 612 represents the time derivative of the current sensed by current sensor 242 before and after the occurrence of the overload condition. When the overload condition occurs at time zero, waveform 612 increases immediately to a high level and then declines quickly. Waveform 610 does not spike is high as waveform 600 at time zero, and waveform 610 declines much more quickly than waveform 600. Both the overloading scenario and the short-circuit fault scenario introduce a transient spike in the second current, but there is no spike for the first current because middle capacitor 238 prevents energy directly feeding from power source 210 to load capacitor 272. Based on the transient amplitude of the current derivative within few microseconds after short-circuit fault, a fault can be detected.

Controller 290 may be configured to distinguish between a fault and an overload condition by comparing a magnitude of the signal sensed by current sensor 242 to a threshold level. Controller 290 may be configured to determine that a magnitude of the signal sensed by current sensor 240 is not greater than a first threshold level. Controller 290 may be configured to also determine that a magnitude of the signal sensed by current sensor 242 is greater than a second threshold level. In response to these determinations, controller 290 may be configured to determine that a fault occurred on the load side of solid state power converter 220.

Thus, controller 290 may be configured to determine where the fault occurred based on which time derivative exceeds a threshold level. Responsive to determining that the source-side signal is greater than a threshold level and that the load-side signal is not greater than a threshold level, controller 290 may be configured to determine that a fault occurred on the source side of solid state power converter 220.

Controller 290 may be configured to also confirm that the fault occurred on a side of solid state power converter 220 by determining that a time derivative of the signal from that side of solid state power converter 220 is still greater than the threshold level after a threshold time duration. For example, controller 290 may be configured to determine whether the time derivative of a signal received from current sensor 242 is greater than a threshold level at a first time. Controller 290 may be configured to then determine whether the time derivative of the signal is greater than the threshold level at a second time that is at least a threshold time duration after the first time. The threshold time duration may be two or three microseconds for detecting a fault in the example shown in FIG. 3.

Figure 7:
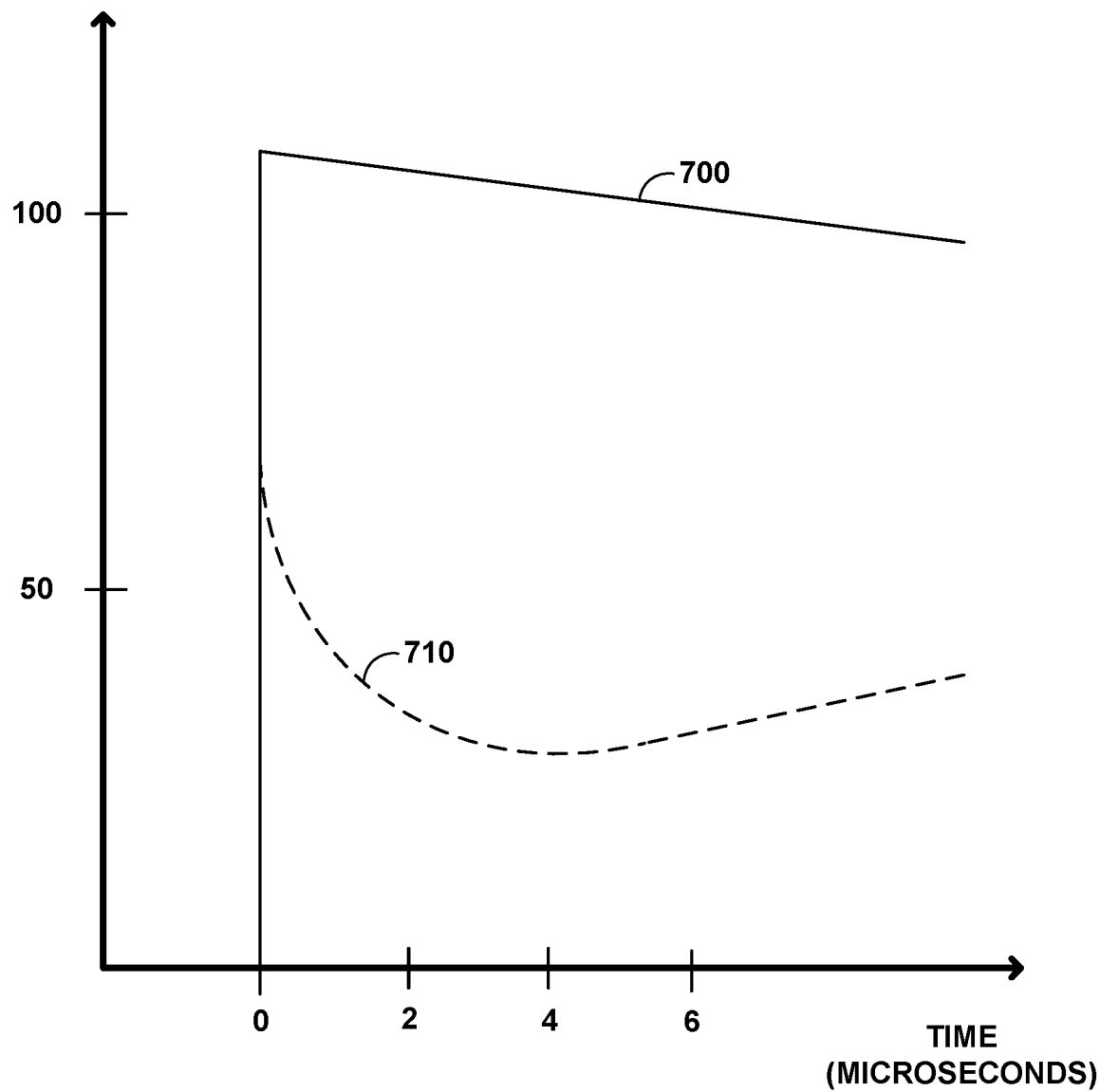

FIG. 7 depicts sums of the time derivatives shown in FIG. 6. Waveform 700 represents a sum of the time derivatives of the currents sensed by current sensors 240 and 242 before and after the occurrence of a fault. Before the occurrence of the fault at time zero, waveforms 700 and 710 are equal to zero because the currents in electrical power system 200 are stable. When the fault occurs at time zero, waveform 700 increases immediately to a high level and then declines slowly. Waveform 710 represents a sum of the time derivatives of the currents sensed by current sensors 240 and 242 before and after the occurrence of an overload condition. When the overload condition occurs at time zero, waveform 710 increases immediately to a moderate level and then declines sharply before stabilizing. Waveforms 700 and 710 can provide a clear difference between a fault and an overload condition. The current derivative sum can be used as another indication signal to check whether there is a fault as there is no sinusoidal oscillation in FIG. 7.

Controller 290 may be configured to determine that the sum of the time derivatives of the currents sensed by current sensors 240 and 242 is greater than a threshold level. In response to this determination, controller 290 may be configured to determine that a fault has occurred. In addition, controller 290 may be configured to determine that the sum of the time derivatives still is greater than the threshold level at least a threshold time duration after the first determination. In response to this further determination, controller 290 may be configured to determine that a fault has occurred.

Figure 8:
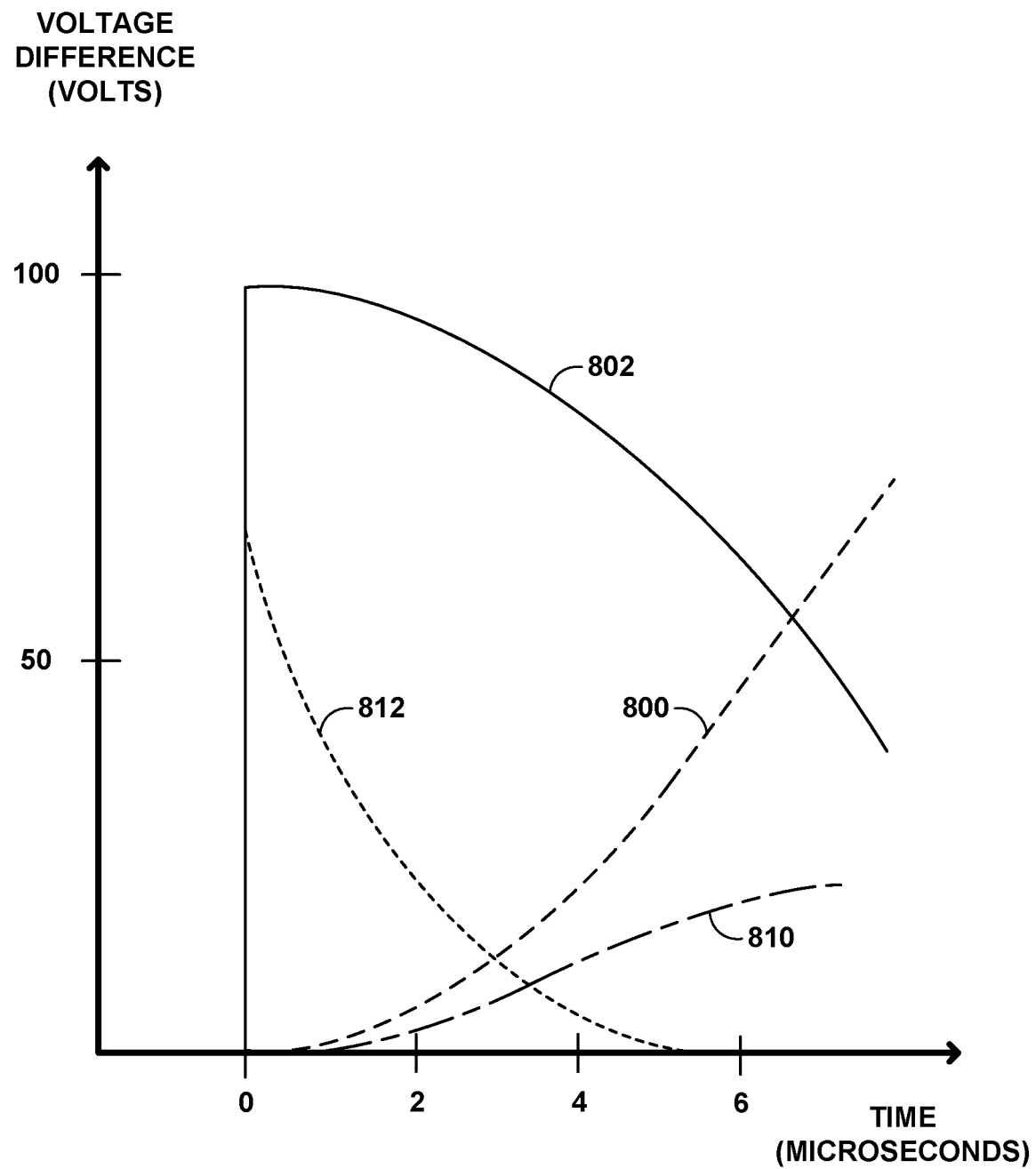

FIG. 8 depicts waveforms 800, 802, 810, and 812 that represent differentials between voltages sensed in electrical power system 200. Waveform 800 represents a difference between the voltages sensed by voltage sensors 250 and 254 before and after the occurrence of a fault. Waveform 802 represents a difference between the voltages sensed by voltage sensors 254 and 252 before and after the occurrence of a fault. Waveform 810 represents a difference between the voltages sensed by voltage sensors 250 and 254 before and after the occurrence of an overload condition. Waveform 812 represents a difference between the voltages sensed by voltage sensors 254 and 252 before and after the occurrence of an overload condition.

Controller 290 may be configured to detect a fault based on a first difference between the voltages sensed by voltage sensors 250 and 254 (e.g., waveform 800) and further based on a second difference between the voltages sensed by voltage sensors 254 and 252 (e.g., waveform 802). For example, controller 290 may be configured to determine that the first difference is not greater than a first threshold level and that the second difference is greater than a second threshold level. Responsive to these determinations, controller 290 may be configured to determine that a fault has occurred on the load side of solid state power converter 220. In addition, controller 290 may be configured to determine that the first difference is not greater than the first threshold level and that the second difference is greater than the second threshold level after at least a threshold time duration. In response to these further determinations, controller 290 may be configured to determine that a fault has occurred on the load side of solid state power converter 220.

Additionally or alternatively, controller 290 may be configured to determine that the first difference is greater than the first threshold level and that the second difference is not greater than the second threshold level. Responsive to these determinations, controller 290 may be configured to determine that a fault has occurred on the source side of solid state power converter 220.

Figure 9:
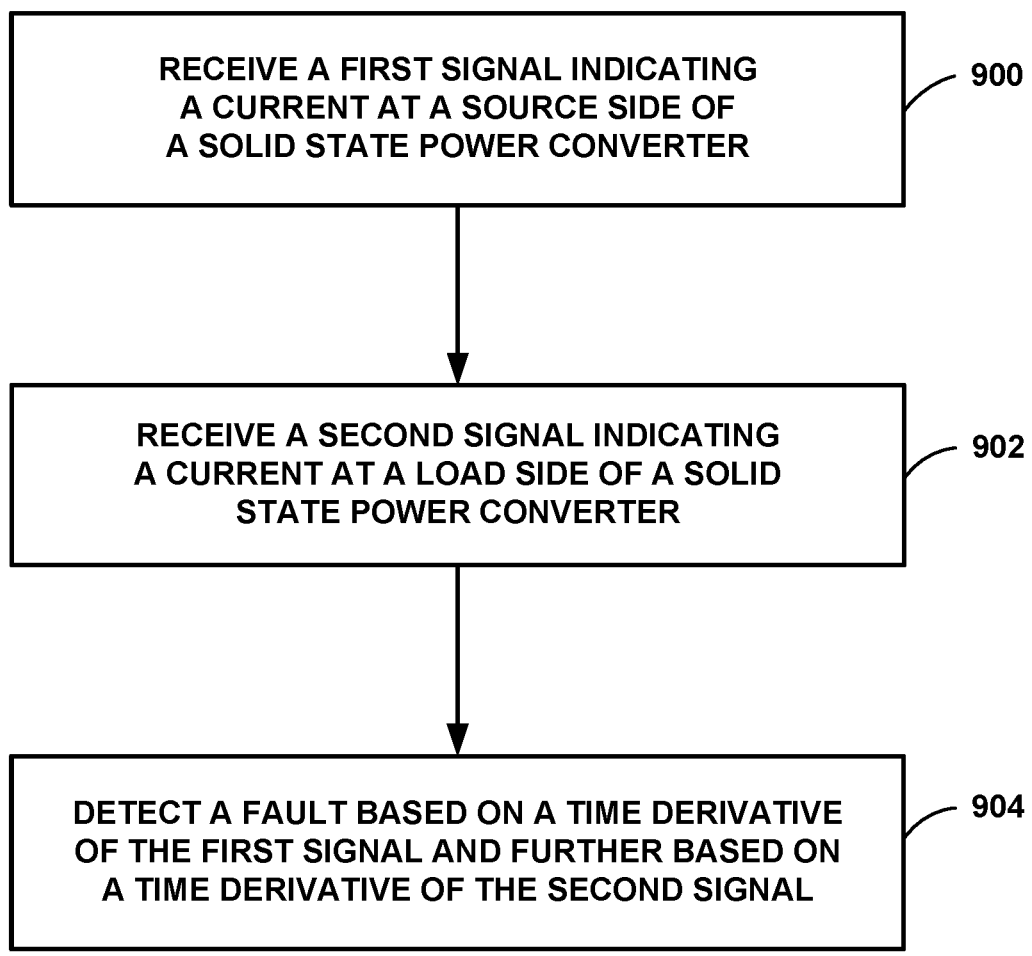
FIGS. 9-11 are flowcharts illustrating example processes for detecting a fault, in accordance with one or more techniques of this disclosure.
Figure 10:
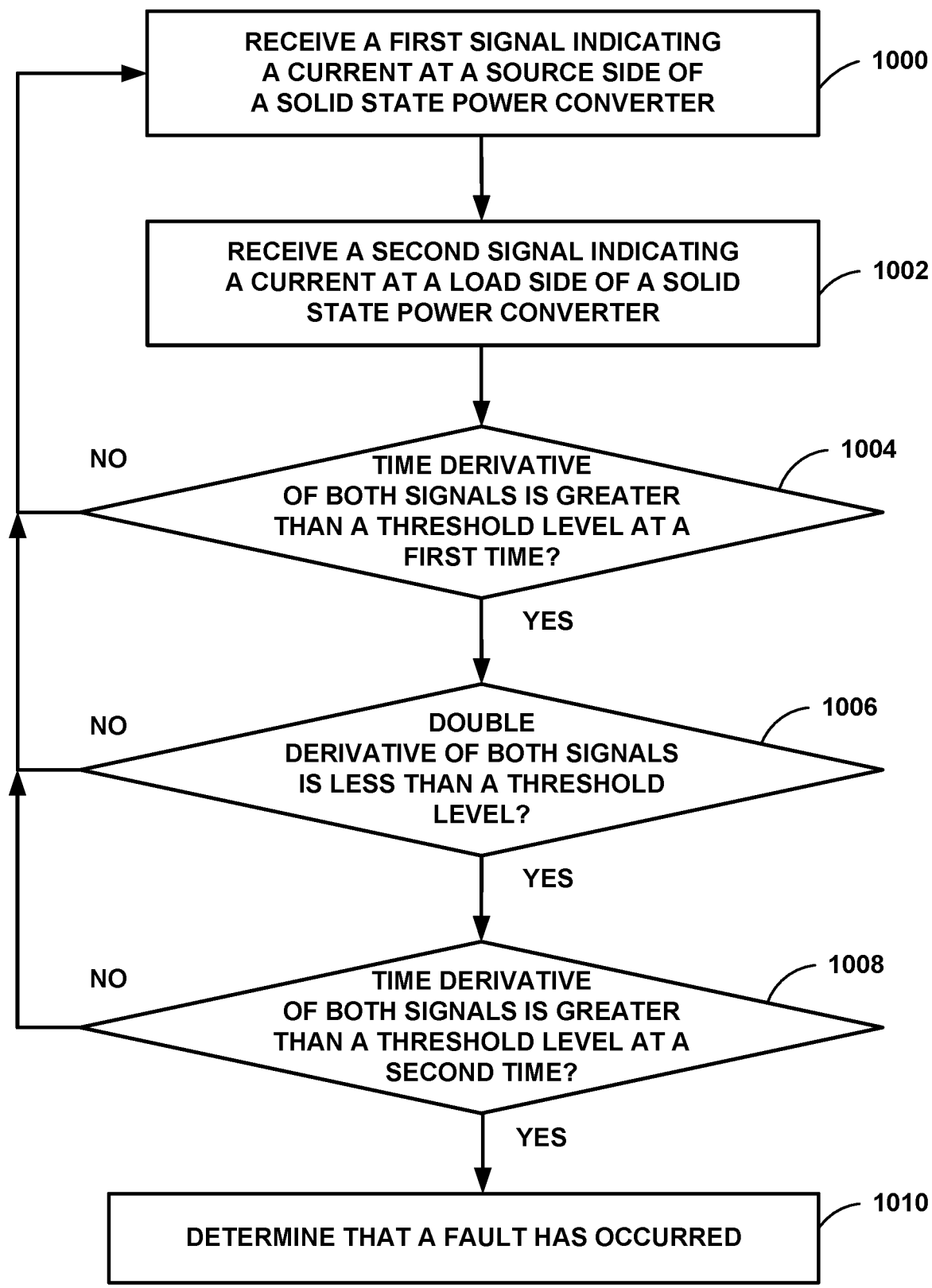
Figure 11:
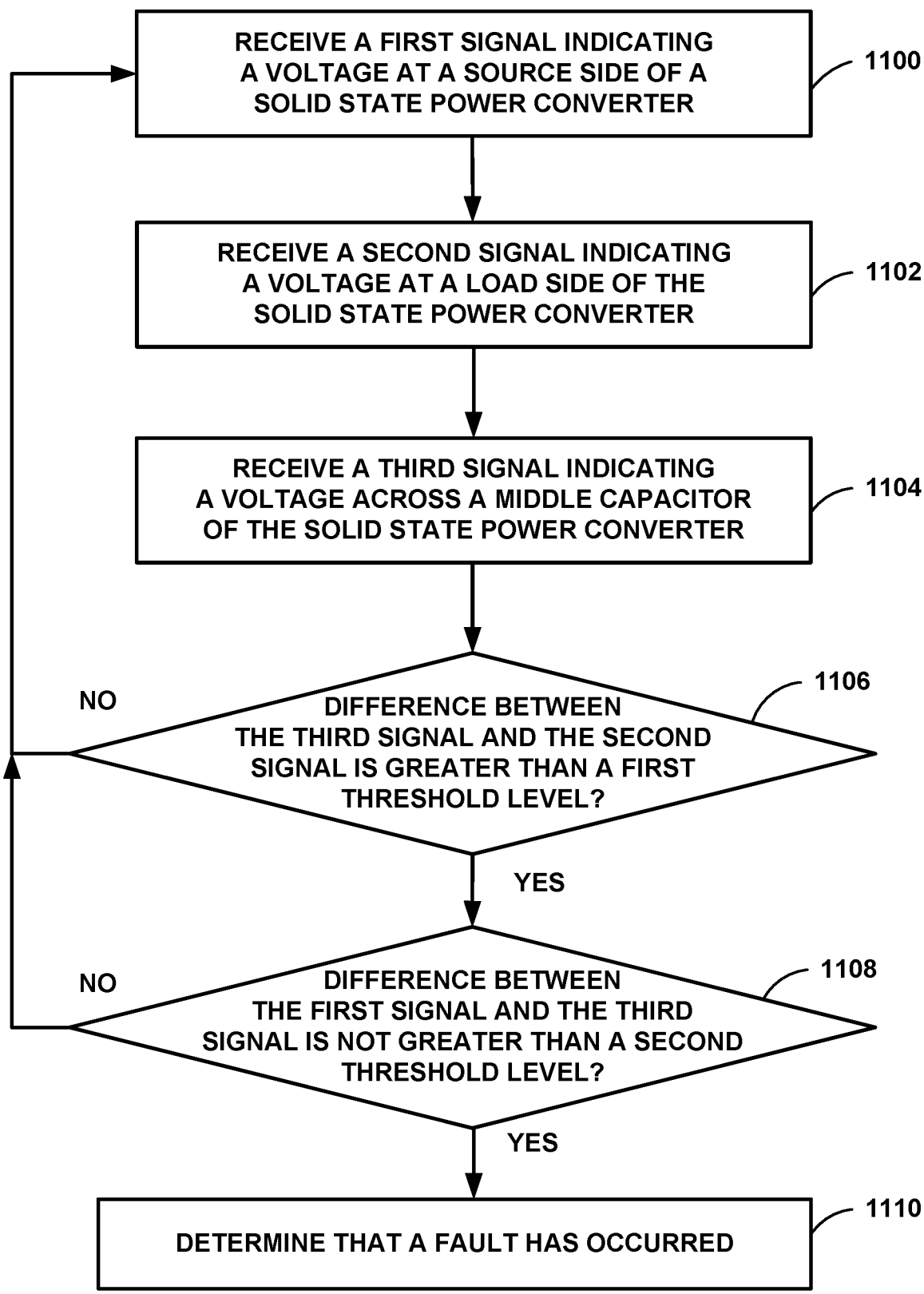

FIGS. 9-11 are flowcharts illustrating example processes for detecting a fault, in accordance with one or more techniques of this disclosure. The techniques of FIGS. 9-11 are described with reference to controller 190 or 290 shown in FIGS. 1 and 2, but the techniques of FIGS. 9-11 may be performed by either of controllers 190 and 290. Controllers 190 and 290 may be configured to perform any of operations 900 through 904 shown in FIG. 9, any of operations 1000 through 1010 shown in FIG. 10, any of operations 1100 through 1110 shown in FIG. 11, or any and all other techniques described with respect to FIGS. 9-11.

In the example of FIG. 9, controller 190 receives a first signal from current sensor 140 indicating a current at a source side of solid state power converter 120 (900). The first signal may indicate the current conducted by source-side switch 131 where current sensor 140 is connected in series with switch 131. Controller 190 also receives a second signal from current sensor 142 indicating a current at a load side of solid state power converter 120 (902). The second signal may indicate the current conducted by load-side switch 133 where current sensor 142 is connected in series with switch 133.

In the example of FIG. 9, controller 190 detects a fault based on a time derivative of the first signal and further based on a time derivative of the second signal (904). Controller 190 may include a circuit for differentiating the first and second signals, such as an operational amplifier with a feedback loop. In response to determining that a magnitude of the time derivative of both signals is greater than a threshold level (e.g., the same or different threshold levels), controller 190 can determine that a fault has occurred in electrical power system 100.

In the example of FIG. 10, controller 190 receives the first signal from current sensor 140 (1000) and receives the second signal from current sensor 142 (1002). Controller 190 then determines whether the time derivative of both signals is greater than a first threshold level at a first time (1004). Controller 190 also determines whether a magnitude of the double time derivative of both signals is less than a second threshold level (1006). In some examples, controller 190 can use the different threshold levels for the first signal and for the second signal.

In the example of FIG. 10, controller 190 determining whether the magnitude of the time derivative of both signals is greater than the first threshold level at a second time (1008). In response to the determinations made in steps 1004, 1006, and 1008, controller 190 determines that a fault has occurred (1010). In response to determining that one or more of the determinations made in steps 1004, 1006, and 1008 indicate that no fault has occurred, controller 190 may be configured to continue monitoring the first and second signals.

In the example of FIG. 11, controller 290 receives a first signal from voltage sensor 250 indicating a voltage at a source side of solid state power converter 220 (1100), a second signal from voltage sensor 252 indicating a voltage at a load side of solid state power converter 220 (1102), and a third signal from voltage sensor 254 indicating a voltage across middle capacitor 238 (1104). Controller 290 then determines whether a difference between the third signal and the second signal is greater than a first threshold level (1106). The difference between the third and second signals may exceed the first threshold level when a fault occurs on the load side of solid state power converter 220 because the voltage across differential bus 260 will decrease rapidly. Controller 290 also determines whether a difference between the first signal and the third signal is not greater than a second threshold level (1108). The difference between the first and third signals should not exceed the second threshold level when a fault occurs on the load side because switches 233 and 234 should isolate middle capacitor 238 from the load side fault.

In response to the determinations made in steps 1104, 1106, and 1108, controller 290 determines that a fault has occurred on the load side of solid state power converter 220 (1110). In response to determining that one or more of the determinations made in steps 1104, 1106, and 1108 indicate that no fault has occurred, controller 290 may be configured to continue monitoring the first and second signals. Although FIG. 11 describes techniques for determining that a load side fault has occurred, controller 290 may be configured to implement similar techniques to determine whether a source side fault has occurred. For example, controller 290 may be configured to determine whether a difference between the first signal and the second signal is greater than the first threshold level. Controller 290 may be configured to also determine whether a difference between the third signal and the first signal is not greater than the second threshold level. In response to making these determinations, controller 290 may be configured to determine that a fault has occurred on the source side of solid state power converter 220.

Figure 12:
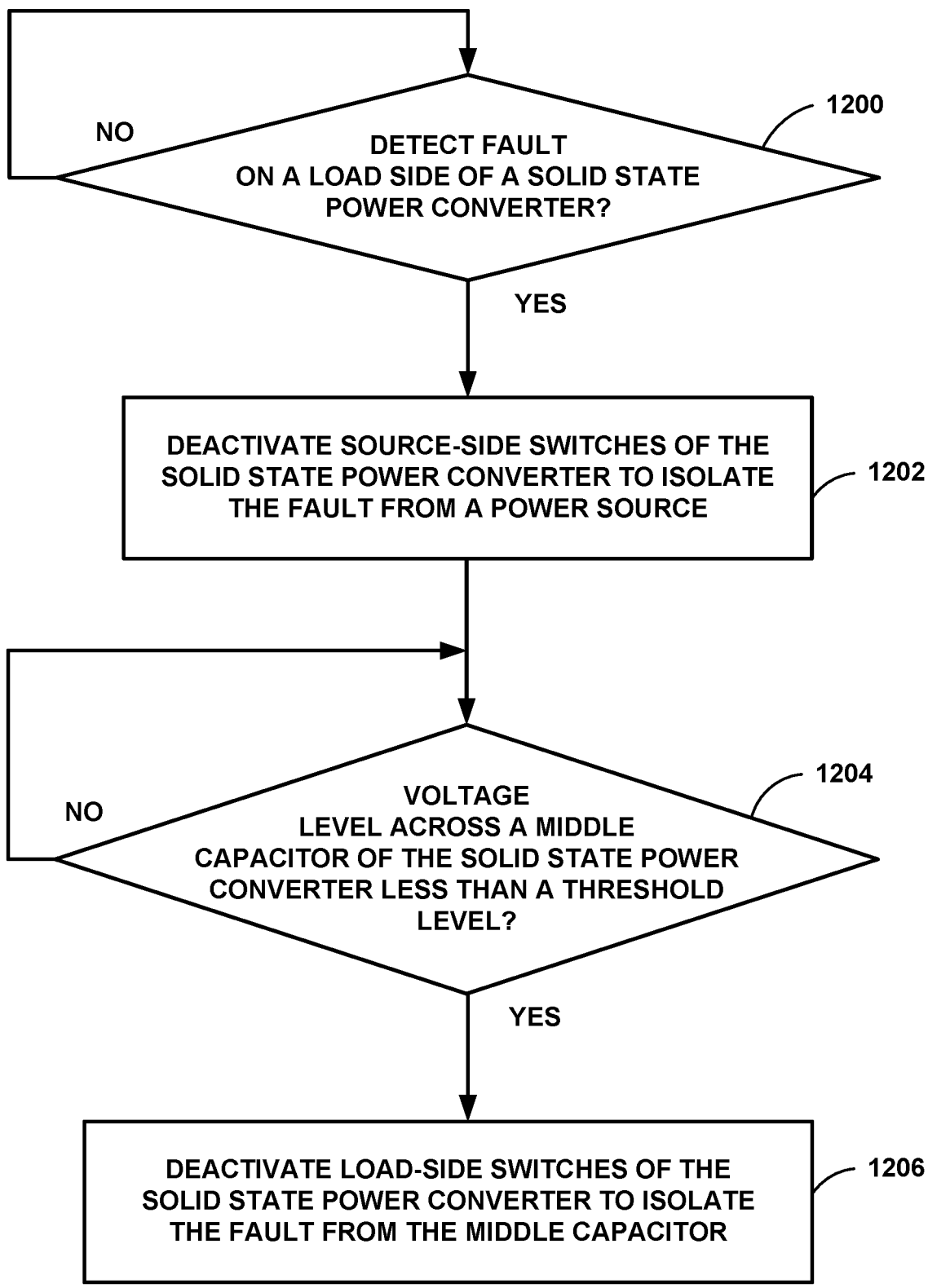
FIGS. 12 and 13 are flowcharts illustrating example processes for deactivating switches in response to detecting a fault, in accordance with one or more techniques of this disclosure.
Figure 13:
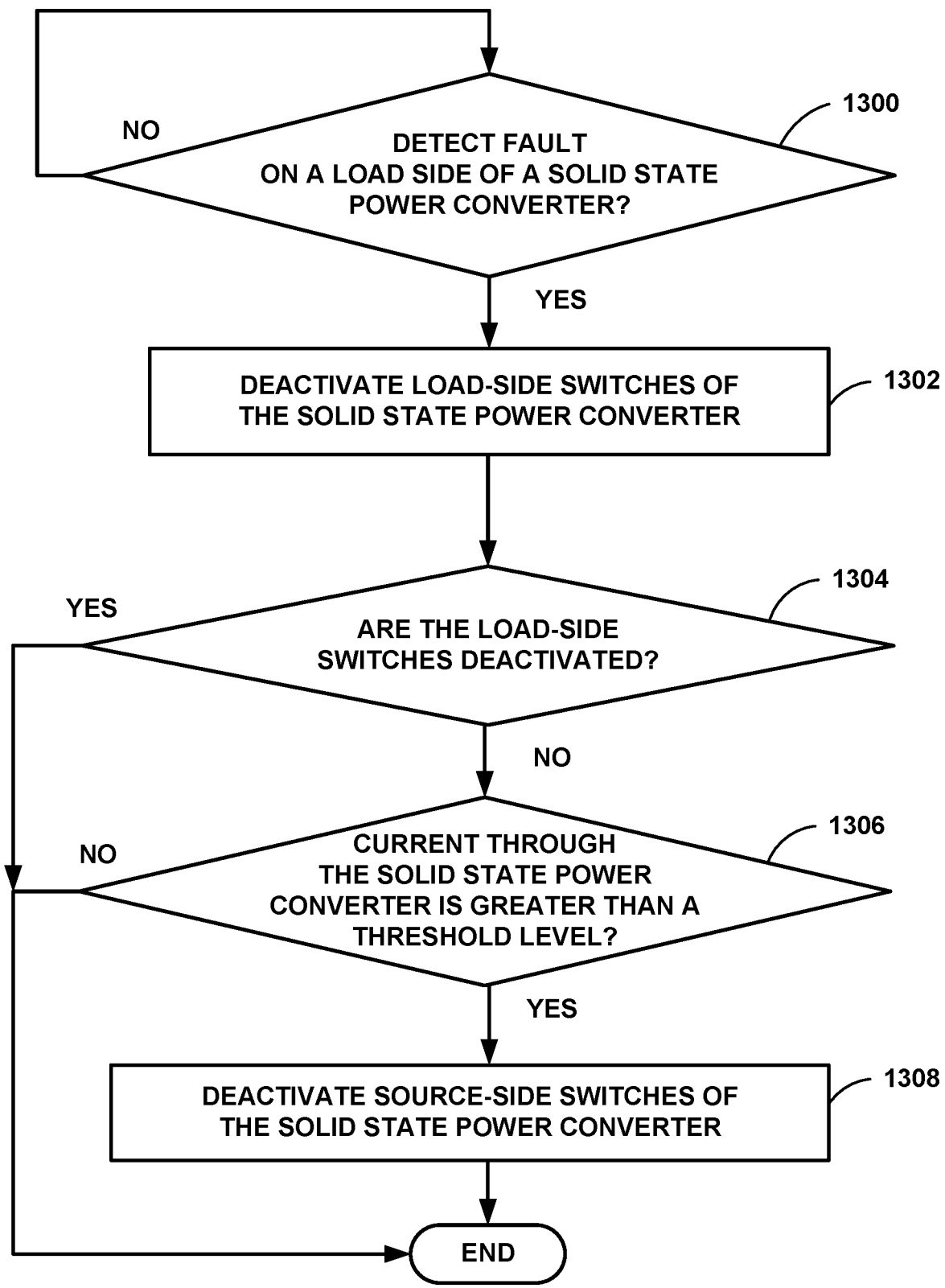

FIGS. 12 and 13 are flowcharts illustrating example processes for deactivating switches in response to detecting a fault, in accordance with one or more techniques of this disclosure. The techniques of FIGS. 12 and 13 are described with reference to controller 290 shown in FIG. 2, but the techniques of FIGS. 12 and 13 may be performed by either of controllers 190 and 290. Controllers 190 and 290 may be configured to perform any of operations 1200 through 1206 shown in FIG. 12, any of operations 1300 through 1308 shown in FIG. 13, or any and all other techniques described with respect to FIGS. 12 and 13.

In the example of FIG. 12, controller 290 detects a fault on a load side of solid state power converter 220 (1200). Controller 290 then deactivates source-side switches 231 and 232 to isolate the fault from power source 210 (1202). When switches 231 and 232 are deactivated, power source 210 is isolated from switches 233 and 234 and middle capacitor 238. Middle capacitor 238 may then discharge to the load side of solid state power converter 220 such that the voltage across middle capacitor 238 will decrease as the charge flows from middle capacitor 238 through switches 233 and 234 to differential bus 260.

Controller 290 next determines whether a voltage level across middle capacitor 238 is less than a threshold level (1204) using a signal received by controller 290 from voltage sensor 254. When the voltage level across middle capacitor 238 is less than the threshold level, middle capacitor 238 has sufficiently discharged to the load side of solid state power converter 220. Controller 290 then deactivates load-side switches 233 and 234 to isolate middle capacitor 238 from the fault on the load side of solid state power converter 220 (1206). Deactivating switches 233 and 234 isolates the fault on the load side of solid state power converter 220. Thus, the techniques depicted in FIG. 12 allow for fully discharging middle capacitor 238 before completely deactivating solid state power converter 220. The techniques depicted in FIG. 12 also provide fault tolerance in case switches 231 and 232 fail to isolate the fault by exploiting the capability of middle capacitor 238.

In the example of FIG. 13, controller 290 detects a fault on a load side of solid state power converter 220 (1300). The fault may occur on differential bus 260 and/or on one or more of the electrical lines connected to switch 233, switch 234, load 270, and/or load capacitor 272. Responsive to detecting the fault, controller 290 deactivates load-side switches 233 and 234 (1302). Deactivating switches 233 and 234 isolates the fault on the load side from power source 210 and switches 231 and 232.

In the example of FIG. 13, controller 290 then determines whether switches 233 and 234 are actually deactivated (1304). Switch 233 or 234 may not actually be deactivated because of a short circuit across the load path of switch 233 or 234, a failure in the gate driver for switch 233 or 234, and/or a disconnection between the gate driver and switch 233 or 234. Controller 290 may be configured to determine whether switches 233 and 234 are actually deactivated by measuring the current through or the voltage across switches 233 and 234. Controller 290 also determines whether the current through solid state power converter 220 is greater than a threshold level (1306) based on signal(s) received by controller 290 from current sensors 240 and/or 242.

In response to determining that one or both of switches 233 and 234 are still active due to deactivation failure and determining that the current through solid state power converter 220 is greater than a threshold level, controller 290 deactivates source-side switches 231 and 232 (1308). Deactivating source-side switches 231 and 232 further isolates the fault from power source 210 when load-side switches 233 and 234 are still allowing current to flow through electrical power system 200. Thus, the techniques depicted in FIG. 13 provide a fail-safe in examples in which switches 233 and 234 cannot deactivate.

FIG. 13 illustrates hybrid fault-tolerant fault detection and protection techniques in either of electrical power systems 100 or 200. In case of load short-circuit fault, the voltage reading difference may indicate the fault signature immediately. When the voltage reading difference is greater than a predefined threshold, the controller can send deactivation commands to switches 233 and 234 to clear the load side short circuit fault. However, switches 233 and 234 may fail to turn off, and the current may continue to increase due to a load side short circuit fault. Controller 290 can monitor the current reading from the current sensors and can deactivate switches 231 and 232 off when the current sensor readings are too large.

Additionally or alternatively, desaturation detection of a solid state power converter can be used as a backup method. Use of two or more fault detection techniques with different detection times may help improve the fault tolerant capability of the solid state power converter. For example, the techniques of this disclosure include using the difference in currents and voltages across a solid state power converter caused by the pre-stored energy in a failsafe middle capacitor, where the middle capacitor is charged or discharged due to a fault occurring at source side or load side. The discharging middle capacitor can cause a huge difference current readings and/or voltage readings.

The following numbered examples demonstrate one or more aspects of the disclosure.

Example 1. A method includes receiving, at circuitry of a controller, a first signal indicating a current at a source side of a solid state power converter. The method also includes receiving, at the circuitry, a second signal indicating a current at a load side of the solid state power converter. The method further includes detecting, by the circuitry, a fault based on a time derivative of the first signal and further based on a time derivative of the second signal.

Example 2. The method of example 1, further including determining that a magnitude of the time derivative of the first signal is greater than a first threshold level.

Example 3. The method of example 1 or example 2, further including determining that a magnitude of the time derivative of the second signal is greater than a second threshold level.

Example 4. The method of the preceding examples or any combination thereof, further including detecting the fault in response to determining that a magnitude of the time derivative of the first signal is greater than a first threshold level.

Example 5. The method of the preceding examples or any combination thereof, further including detecting the fault in response to determining that a magnitude of the time derivative of the second signal is greater than a second threshold level.

Example 6. The method of the preceding examples or any combination thereof, further including determining, at a first time, that a magnitude of the time derivative of the first signal is greater than a first threshold level.

Example 7. The method of the preceding examples or any combination thereof, further including determining, at a second time at least a threshold time duration after the first time, that a magnitude of the time derivative of the first signal is greater than a first threshold level.

Example 8. The method of the preceding examples or any combination thereof, further including detecting the fault in response to determining that a magnitude of the time derivative of the first signal is greater than a first threshold level at the first time.

Example 9. The method of the preceding examples or any combination thereof, further including detecting the fault in response to determining that a magnitude of the time derivative of the second signal is greater than a second threshold level at the second time.

Example 10. The method of the preceding examples or any combination thereof, further including determining that a magnitude of a second time derivative of the first signal is less than a first threshold level.

Example 11. The method of the preceding examples or any combination thereof, further including determining that a magnitude of a second time derivative of the second signal is less than a second threshold level.

Example 12. The method of the preceding examples or any combination thereof, further including detecting the fault in response to determining that a magnitude of the second time derivative of the first signal is less than a first threshold level.

Example 13. The method of the preceding examples or any combination thereof, further including detecting the fault in response to determining that a magnitude of the second time derivative of the second signal is less than a second threshold level.

Example 14. The method of the preceding examples or any combination thereof, further including determining that a magnitude of the first signal is not greater than a first threshold level.

Example 15. The method of the preceding examples or any combination thereof, further including determining that a magnitude of the second signal is greater than a second threshold level.

Example 16. The method of the preceding examples or any combination thereof, further including determining, in response to determining that a magnitude of the first signal is not greater than a first threshold level and determining that a magnitude of the second signal is greater than a second threshold level, that the fault occurred on the load side of the solid state power converter.

Example 17. The method of the preceding examples or any combination thereof, further including determining that a magnitude of the time derivative of the first signal is not greater than a first threshold level.

Example 18. The method of the preceding examples or any combination thereof, further including determining that a magnitude of the time derivative of the second signal is greater than a second threshold level.

Example 19. The method of the preceding examples or any combination thereof, further including determining, in response to determining that a magnitude of the time derivative of the first signal is not greater than a first threshold level and determining that a magnitude of the time derivative of the second signal is greater than a second threshold level, that the fault occurred on the load side of the solid state power converter.

Example 20. The method of the preceding examples or any combination thereof, further including determining a sum of the time derivative of the first signal and the time derivative of the second signal.

Example 21. The method of the preceding examples or any combination thereof, further including determining that a sum of the time derivative of the first signal and the time derivative of the second signal is greater than a threshold level.

Example 22. The method of the preceding examples or any combination thereof, further including detecting the fault in response to determining that a sum of the time derivative of the first signal and the time derivative of the second signal is greater than the threshold level.

Example 23. The method of the preceding examples or any combination thereof, further including determining, at a first time, that a sum of the time derivative of the first signal and the time derivative of the second signal is greater than the threshold level.

Example 24. The method of the preceding examples or any combination thereof, further including determining, at a second time at least a threshold time duration after the first time, that a sum of the time derivative of the first signal and the time derivative of the second signal is greater than the threshold level.

Example 25. The method of the preceding examples or any combination thereof, further including detecting, in response to determining that a sum of the time derivative of the first signal and the time derivative of the second signal is greater than the threshold level at the first time and determining that the sum is greater than the threshold level at the second time, the fault.

Example 26. The method of the preceding examples or any combination thereof, further including detecting the fault based on the time derivative of the first signal and further based on the time derivative of the second signal by detecting the fault in a first instance.

Example 27. The method of the preceding examples or any combination thereof, further including receiving a third signal indicating a voltage at the source side of the solid state power converter.

Example 28. The method of the preceding examples or any combination thereof, further including receiving a fourth signal indicating a voltage across the differential bus.

Example 29. The method of the preceding examples or any combination thereof, further including receiving a fifth signal indicating a voltage across the middle capacitor.

Example 30. The method of the preceding examples or any combination thereof, further including detecting a second instance of the fault based on a first difference between the third signal and the fifth signal and further based on a second difference between the fifth signal and the fourth signal.

Example 31. The method of the preceding examples or any combination thereof, further including determining, at a first time, that the first difference is not greater than a first threshold level and that the second difference is greater than a second threshold level.

Example 32. The method of the preceding examples or any combination thereof, further including determining, at a second time at least a threshold time duration after the first time, that the first difference is not greater than a first threshold level and that the second difference is greater than a second threshold level.

Example 33. The method of the preceding examples or any combination thereof, further including detecting the second instance of the fault in response to determining that the first difference is not greater than a first threshold level and that the second difference is greater than a second threshold level at the first time Example 34. The method of the preceding examples or any combination thereof, further including detecting the second instance of the fault in response to determining that the first difference is not greater than a first threshold level and that the difference is greater than a second threshold level at the second time.

Example 35. The method of the preceding examples or any combination thereof, further including determining that the fault occurred at the load side of the solid state power converter.

Example 36. The method of the preceding examples or any combination thereof, further including deactivating the first set of switches in response to determining that the fault occurred at the load side.

Example 37. The method of the preceding examples or any combination thereof, further including determining, after deactivating the first set of switches, that a voltage across a middle capacitor of the solid state power converter is less than a threshold voltage.

Example 38. The method of the preceding examples or any combination thereof, further including deactivating the second set of switches in response to determining that the voltage across the middle capacitor is less than the threshold voltage.

Example 39. The method of the preceding examples or any combination thereof, further including determining that the fault occurred at the load side of the solid state power converter.

Example 40. The method of the preceding examples or any combination thereof, further including deactivating the second set of switches in response to determining that the fault occurred at the load side.

Example 41. The method of the preceding examples or any combination thereof, further including determining, after deactivating the second set of switches, that at least one switch of the second set of switches is still active.

Example 42. The method of the preceding examples or any combination thereof, further including determining, in response to determining that the at least one switch is still active, that the first signal or the second signal is greater than a threshold level.

Example 43. The method of the preceding examples or any combination thereof, further including deactivating, in response to determining that the at least one switch is still active and determining that the first signal is greater than the threshold level, the first set of switches.

Example 44. An electrical power system including a solid state power converter and a controller configured to perform the method of the preceding examples or any combination thereof.

Example 45. An electrical power system includes a solid state power converter including a first set of switches on a source side of the solid state power converter and a second set of switches on a load side of the solid state power converter. The electrical power system also includes a power source connected to the source side of the solid state power converter and also includes a differential bus connected to the load side of the solid state power converter. The electrical power system further includes a controller configured to receive a first signal indicating a current at the source side and receive a second signal indicating a current at the load side. The controller is further configured to detect, based on a time derivative of the first signal and a time derivative of the second signal, a fault in the electrical power system.

Example 46. An electrical power system includes a solid state power converter including a first set of switches on a source side of the solid state power converter, a second set of switches on a load side of the solid state power converter, and a middle capacitor connected between the first set of switches and the second set of switches. The electrical power system also includes a power source connected to the source side of the solid state power converter and further includes a differential bus connected to the load side of the solid state power converter. The electrical power system a controller configured to receive a first signal indicating a voltage level at the source side of the solid state power converter, receive a second signal indicating a voltage level across the differential bus, and receive a third signal indicating a voltage level across the middle capacitor. The controller is further configured to detect a fault in the electrical power system based on a first difference between the first signal and the third signal and further based on a second difference between the third signal and the second signal.

Example 47. A device includes a computer-readable medium having executable instructions stored thereon, configured to be executable by processing circuitry for causing the processing circuitry to perform the method of examples 1-43 or any combination thereof.

Example 48. A system comprising means for performing each of the method steps of examples 1-43 or any combination thereof.

Various examples have been described. Any combination of the described systems, operations, or functions is contemplated. These and other examples are within the scope of the following claims.

What is claimed is:

1. An electrical power system comprising:
   a solid state power converter including a first set of switches on a source side of the solid state power converter and a second set of switches on a load side of the solid state power converter;
   a power source connected to the source side of the solid state power converter;
   a differential bus connected to the load side of the solid state power converter; and
   a controller configured to:
      receive, during a first time period, a first signal indicating a current at the source side of the solid state power converter;
      receive, during the first time period, a second signal indicating a current at the load side of the solid state power converter;
      determine a time derivative of the first signal which represents a rate of change of the current at the source side during the first time period;
      determine a time derivative of the second signal which represents a rate of change of the current at the load side during the first time period;
      detect, based on the time derivative of the first signal and the time derivative of the second signal, a fault in the electrical power system; and
      in response to detecting the fault based on the time derivative of the first signal and the time derivative of the second signal, cause the first set of switches to open.

2. The electrical power system of claim 1, wherein the controller is configured to:
   determine that a magnitude of the time derivative of the first signal is greater than a first threshold level;

determine that a magnitude of the time derivative of the second signal is greater than a second threshold level; and detect the fault in response to:
determining that the magnitude of the time derivative of the first signal is greater than the first threshold level; and
determining that the magnitude of the time derivative of the second signal is greater than the second threshold level.

3. The electrical power system of claim 2, wherein the controller is configured to:
determine, at a first time, that the magnitude of the time derivative of the first signal is greater than the first threshold level;
determine, at a second time at least a threshold time duration after the first time, that the magnitude of the time derivative of the first signal is greater than the first threshold level; and
detect the fault in response to:
determining that the magnitude of the time derivative of the first signal is greater than the first threshold level at the first time; and
determining that the magnitude of the time derivative of the first signal is greater than the first threshold level at the second time.

4. The electrical power system of claim 1, wherein the controller is configured to:
determine that a magnitude of a second time derivative of the first signal is less than a first threshold level;
determine that a magnitude of a second time derivative of the second signal is less than a second threshold level; and
detect the fault in response to:
determining that the magnitude of the second time derivative of the first signal is less than the first threshold level; and
determining that the magnitude of the second time derivative of the second signal is less than the second threshold level.

5. The electrical power system of claim 1, wherein the controller is configured to:
determine that a magnitude of the first signal is not greater than a first threshold level;
determine that a magnitude of the second signal is greater than a second threshold level; and
determine, in response to determining that the magnitude of the first signal is not greater than the first threshold level and determining that the magnitude of the second signal is greater than the second threshold level, that the fault occurred on the load side of the solid state power converter.

6. The electrical power system of claim 1, wherein the controller is configured to:
determine that a magnitude of the time derivative of the first signal is not greater than a first threshold level;
determine that a magnitude of the time derivative of the second signal is greater than a second threshold level; and
determine, in response to determining that the magnitude of the time derivative of the first signal is not greater than the first threshold level and determining that the magnitude of the time derivative of the second signal is greater than the second threshold level, that the fault occurred on the load side of the solid state power converter.

7. The electrical power system of claim 1, wherein the controller is configured to:
determine a sum of the time derivative of the first signal and the time derivative of the second signal;
determine that the sum is greater than a threshold level; and
detect the fault in response to determining that the sum is greater than the threshold level.

8. The electrical power system of claim 7, wherein the controller is configured to:
determine, at a first time, that the sum is greater than the threshold level;
determine, at a second time at least a threshold time duration after the first time, that the sum is greater than the threshold level; and
detect, in response to determining that the sum is greater than the threshold level at the first time and determining that the sum is greater than the threshold level at the second time, the fault.

9. The electrical power system of claim 1,
wherein the solid state power converter further comprises a middle capacitor connected between the first set of switches and the second set of switches, and
wherein the controller is configured to:
detect the fault based on the time derivative of the first signal and further based on the time derivative of the second signal by detecting the fault in a first instance;
receive a third signal indicating a voltage at the source side of the solid state power converter;
receive a fourth signal indicating a voltage across the differential bus;
receive a fifth signal indicating a voltage across the middle capacitor; and
detect a second instance of the fault based on a first difference between the third signal and the fifth signal and further based on a second difference between the fifth signal and the fourth signal.

10. The electrical power system of claim 9, wherein the controller is configured to:
determine, at a first time, that the first difference is not greater than a first threshold level and that the second difference is greater than a second threshold level;
determine, at a second time at least a threshold time duration after the first time, that the first difference is not greater than a first threshold level and that the second difference is greater than a second threshold level; and
detect the second instance of the fault in response to:
determining that the first difference is not greater than the first threshold level and that the second difference is greater than the second threshold level at the first time; and
determining that the first difference is not greater than the first threshold level and that the difference is greater than the second threshold level at the second time.

11. The electrical power system of claim 1, wherein the controller is configured to:
determine that the fault occurred at the load side of the solid state power converter;
deactivate the first set of switches in response to determining that the fault occurred at the load side;
determine, after deactivating the first set of switches, that a voltage across a middle capacitor of the solid state power converter is less than a threshold voltage; and deactivate the second set of switches in response to determining that the voltage across the middle capacitor is less than the threshold voltage.

12. The electrical power system of claim 1, wherein the controller is configured to:
determine that the fault occurred at the load side of the solid state power converter;
deactivate the second set of switches in response to determining that the fault occurred at the load side;
determine, after deactivating the second set of switches, that at least one switch of the second set of switches is still active;
determine, in response to determining that the at least one switch is still active, that the first signal or the second signal is greater than a threshold level; and
deactivate, in response to determining that the at least one switch is still active and determining that the first signal is greater than the threshold level, the first set of switches.

13. A method comprising:
receiving, at circuitry of a controller and during a first time period, a first signal indicating a current at a source side of a solid state power converter;
receiving, at the circuitry and during the first time period, a second signal indicating a current at a load side of the solid state power converter;
determining a time derivative of the first signal which represents a rate of change of the current at the source side during the first time period;
determining a time derivative of the second signal which represents a rate of change of the current at the load side during the first time period;
detecting, by the circuitry, a fault based on the time derivative of the first signal and further based on the time derivative of the second signal; and
responsive to detecting the fault based on the time derivative of the first signal and the time derivative of the second signal, opening load side switches.

14. The method of claim 13, further comprising:
determining that a magnitude of the time derivative of the first signal is greater than a first threshold level; and
determining that a magnitude of the time derivative of the second signal is greater than a second threshold level,
wherein detecting the fault is in response to determining that the magnitude of the time derivative of the first signal is greater than the first threshold level and is further in response to determining that the magnitude of the time derivative of the second signal is greater than the second threshold level.

15. The method of claim 13, further comprising:
determining that a magnitude of a second time derivative of the first signal is greater than a first threshold level; and
determining that a magnitude of a second time derivative of the second signal is greater than a second threshold level,
wherein detecting the fault is in response to determining that the magnitude of the second time derivative of the first signal is greater than the first threshold level and is further in response to determining that the magnitude of the second time derivative of the second signal is greater than the second threshold level.

16. The method of claim 13, further comprising:
determining that a magnitude of the first signal is not greater than a first threshold level;
determining that a magnitude of the second signal is greater than a second threshold level; and
determining, in response to determining that the magnitude of the first signal is not greater than the first threshold level and further in response to determining that the magnitude of the second signal is greater than the second threshold level, that the fault occurred on the load side of the solid state power converter.

17. The method of claim 13, further comprising:
determining a sum of the time derivative of the first signal and the time derivative of the second signal; and
determining that the sum is greater than a threshold level,
wherein detecting the fault is in response to determining that the sum is greater than the threshold level.

18. The method of claim 13, further comprising:
receiving, after opening the load side switches, a third signal indicating a current flowing through the load side; and
open, responsive to a level of the current indicated by the third signal being greater than a threshold level, source side switches.

* * * * *